United States Patent
Tain et al.

(10) Patent No.: US 8,552,554 B2
(45) Date of Patent: Oct. 8, 2013

(54) HEAT DISSIPATION STRUCTURE FOR ELECTRONIC DEVICE AND FABRICATION METHOD THEREOF

(75) Inventors: Ra-Min Tain, New Taipei (TW); Ming-Ji Dai, Hsinchu (TW); Yon-Hua Tzeng, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 28 days.

(21) Appl. No.: 13/332,144

(22) Filed: Dec. 20, 2011

(65) Prior Publication Data

US 2012/0092834 A1    Apr. 19, 2012

Related U.S. Application Data

(63) Continuation-in-part of application No. 12/975,326, filed on Dec. 21, 2010, now Pat. No. 8,278,755.

(30) Foreign Application Priority Data

Aug. 12, 2010  (TW) ............................... 99126890 A

(51) Int. Cl.
   *H01L 23/48* (2006.01)
(52) U.S. Cl.
   USPC ........... 257/737; 257/713; 257/675; 257/686; 257/698; 257/751; 257/E21.499; 257/E33.056; 257/E21.09; 257/E21.648
(58) Field of Classification Search
   USPC .................. 257/737, 774, 675, 758, E23.011, 257/E21.158; 438/122
   See application file for complete search history.

(56) References Cited

U.S. PATENT DOCUMENTS

| | | | |
|---|---|---|---|
| 6,596,624 B1 | 7/2003 | Romankiw | |
| 6,783,589 B2 | 8/2004 | Dahl et al. | |
| 2002/0068377 A1 | 6/2002 | Oku et al. | |
| 2002/0120296 A1 | 8/2002 | Mech et al. | |
| 2007/0126115 A1* | 6/2007 | Yanagihara et al. | 257/712 |
| 2007/0257265 A1 | 11/2007 | Naguib et al. | |
| 2008/0087930 A1* | 4/2008 | Lee et al. | 257/300 |
| 2009/0075428 A1 | 3/2009 | Tang et al. | |

(Continued)

FOREIGN PATENT DOCUMENTS

| | | |
|---|---|---|
| CN | 101583559 | 11/2009 |
| TW | 200915505 | 4/2009 |
| TW | 200919905 | 5/2009 |
| TW | 200945961 | 11/2009 |

OTHER PUBLICATIONS

Taiwan Patent Office, Notice of Allowance, Patent Application Serial No. 099126890, Apr. 2, 2013, Taiwan.
Notice of Allowance, U.S. Appl. No. 12/975,326, Jul. 20, 2012, US Patent Office.
China Patent Office, Office Action, Patent Application Serial No. 201010283714.X, Feb. 27, 2013, China.

*Primary Examiner* — Jerome Jackson, Jr.
*Assistant Examiner* — Bo Fan

(57) ABSTRACT

A heat dissipation structure for an electronic device includes a body having a first surface and a second surface opposite to the first surface. A silicon-containing insulating layer is disposed on the first surface of the body. A chemical vapor deposition (CVD) diamond film is disposed on the silicon-containing insulating layer. A first conductive pattern layer is disposed on the silicon-containing insulating layer, wherein the first conductive pattern layer is enclosed by and spaced apart from the CVD diamond film. A method for fabricating a heat dissipation structure for an electronic device and an electronic package having the heat dissipation structure are also disclosed.

26 Claims, 50 Drawing Sheets

(56) References Cited

U.S. PATENT DOCUMENTS

| | | |
|---|---|---|
| 2009/0152725 A1* | 6/2009 | Dalal et al. ................... 257/751 |
| 2009/0258449 A1* | 10/2009 | Dai et al. ........................ 438/26 |
| 2009/0294899 A1* | 12/2009 | Pagaila et al. ................ 257/528 |
| 2009/0294947 A1* | 12/2009 | Tain et al. ..................... 257/686 |
| 2010/0051964 A1 | 3/2010 | Lin et al. |
| 2010/0065942 A1 | 3/2010 | Lin et al. |
| 2010/0148326 A1* | 6/2010 | Mohammad et al. ......... 257/666 |
| 2011/0068468 A1 | 3/2011 | Lin et al. |
| 2011/0193225 A1 | 8/2011 | Chen et al. |

\* cited by examiner

US 8,552,554 B2

HEAT DISSIPATION STRUCTURE FOR ELECTRONIC DEVICE AND FABRICATION METHOD THEREOF

CROSS REFERENCE TO RELATED APPLICATIONS

This application is a Continuation-In-Part of pending U.S. patent application Ser. No. 12/975,326, filed Dec. 21, 2010 and entitled "HEAT DISSIPATION STRUCTURE FOR ELECTRONIC DEVICE AND FABRICATION METHOD THEREOF", which claims priority of Taiwan Patent Application No. 099126890, filed on Aug. 12, 2010, the entirety of which is incorporated by reference herein.

BACKGROUND

1. Technical Field

The disclosure relates to the fabrication of an integrated circuit (IC), and more particularly to a heat dissipation structure for an electronic device and method for fabricating the same.

2. Description of the Related Art

Demand for small, high performance portable electronic products such as mobile phones, portable computers, and the like, along with development in the semiconductor industry, have driven the semiconductor industry to increase electronic devices (e.g., IC chips) integration and density. As a result, as electronic device integration and density is increased, electronic device power and operation frequency are also increased. Accordingly, heat dissipation is one of the major factors that may limit the performance of highly integrated and dense electronic devices.

Conventional methods to combat the presence of heat during electronic device operation typically include providing a heat dissipation device (i.e., heat spreader) in thermal contact with IC chips in the package module. Namely, the upper surface of each IC chip is in thermal contact with a corresponding heat spreader. A separated heat spreader provided for each IC chip, however, may increase the manufacturing cost and increase the entire size of the electronic package device, which hinders electronic device integration and increased density for electronic devices.

Another method to combat the presence of heat during electronic device operation includes providing a diamond like carbon (DLC) film on an upper surface of the IC chip or the package substrate thereof, to serve as a passivation layer and a thermally conductive electrical insulated layer. Openings are typically formed in the passivation layer for formation of the redistribution line (RDL)/circuit track or bond pad formed of metal.

Accordingly, there is still a need to develop a heat dissipation structure for an electronic device capable of addressing the above problems.

SUMMARY

A detailed description is given in the following embodiments with reference to the accompanying drawings. A heat dissipation structure for an electronic device and the method for fabricating the same are provided. An embodiment of a heat dissipation structure for an electronic device includes a body having a first surface and a second surface opposite to the first surface. A silicon-containing insulating layer is disposed on the first surface of the body. An ultrananocrystalline diamond (UNCD) film is disposed on the silicon-containing insulating layer. A first conductive pattern layer is disposed on the silicon-containing insulating layer and enclosed by the ultrananocrystalline diamond film, wherein the ultrananocrystalline diamond film and the first conductive pattern layer do not overlap with each other as viewed from a top-view perspective.

Another embodiment of a heat dissipation structure for an electronic device includes a body having a first surface and a second surface opposite to the first surface. A silicon-containing insulating layer is disposed on the first surface of the body. A chemical vapor deposition (CVD) diamond film is disposed on the silicon-containing insulating layer. A first conductive pattern layer is disposed on the silicon-containing insulating layer, wherein the first conductive pattern layer is enclosed by and spaced apart from the CVD diamond film.

An embodiment of a method for fabricating a heat dissipation structure for an electronic device includes providing a body having a first surface and a second surface opposite to the first surface. A silicon-containing insulating layer is formed on the first surface of the body. A first conductive pattern layer and an ultrananocrystalline diamond film are formed on the silicon-containing insulating layer, wherein the first conductive pattern layer is enclosed by the ultrananocrystalline diamond film and wherein the ultrananocrystalline diamond film and the first conductive pattern layer do not overlap with each other as viewed from a top-view perspective.

Another embodiment of a method for fabricating a heat dissipation structure for an electronic device includes providing a body having a first surface and a second surface opposite to the first surface. A silicon-containing insulating layer is formed on the first surface of the body. A first conductive pattern layer and a CVD diamond film are formed on the silicon-containing insulating layer, wherein the first conductive pattern layer is enclosed by and spaced apart from the CVD diamond film.

BRIEF DESCRIPTION OF DRAWINGS

The disclosure can be more fully understood by reading the subsequent detailed description and examples with references made to the accompanying drawings, wherein:

FIG. 6J-1 is a cross section of an exemplary embodiment of a heat dissipation structure for an electronic device according to the disclosure;

FIG. 7F-1 is a cross section of an exemplary embodiment of a heat dissipation structure for an electronic device according to the disclosure;

FIG. 7G-1 is a cross section of an exemplary embodiment of a 3DIC with the heat dissipation structure shown in FIG. 7F-1;

DETAILED DESCRIPTION

The following description is provided for the purpose of illustrating the general principles of the disclosure and should not be taken in a limiting sense. The scope of the disclosure is best determined by reference to the appended claims.

Figure 1:
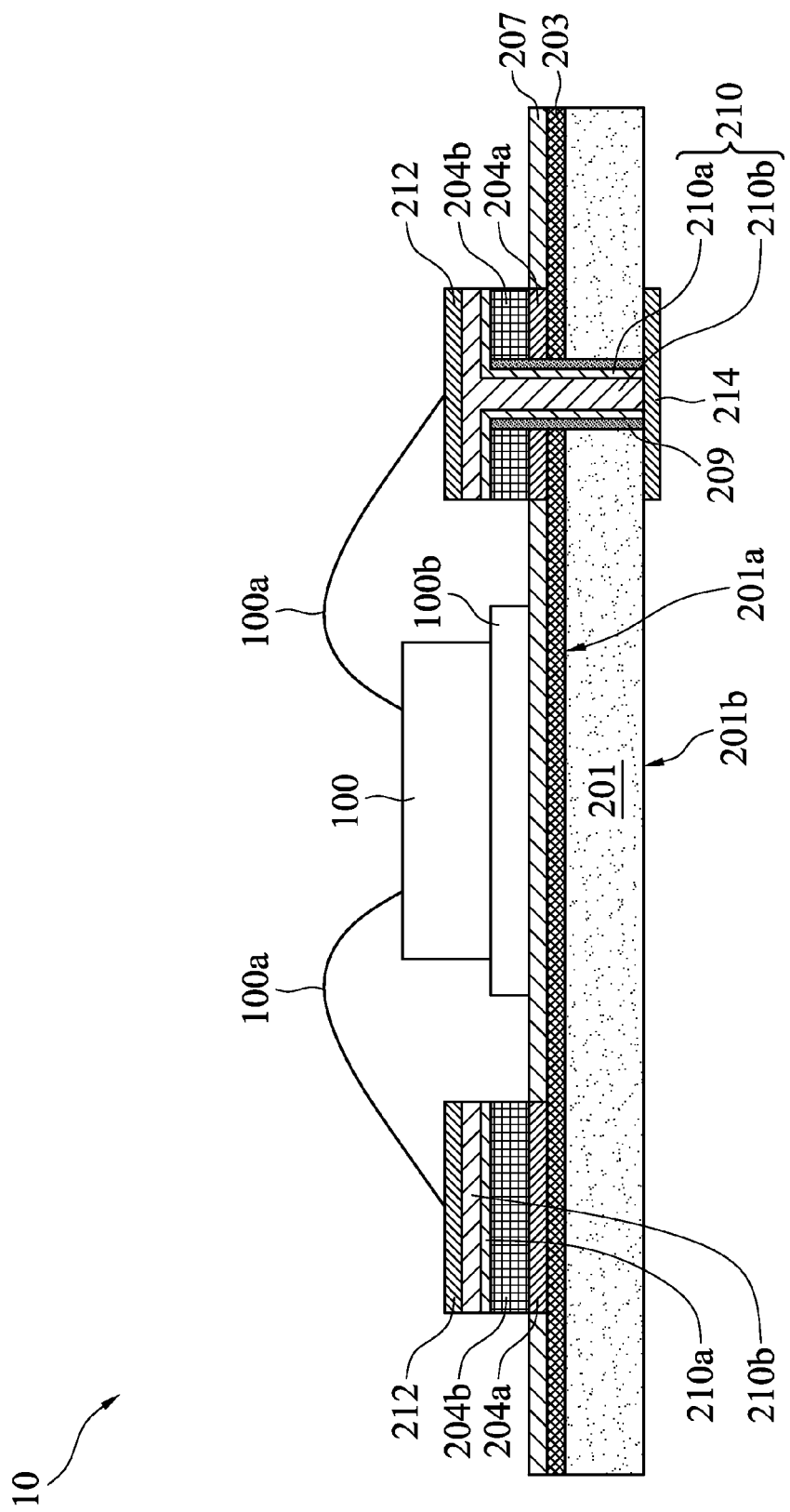
FIGS. 1 to 3 and FIGS. 1-1 to 3-1 are cross sections of various exemplary embodiments of an electronic packages having a heat dissipation structure for an electronic device according to the disclosure.
Figure 1:
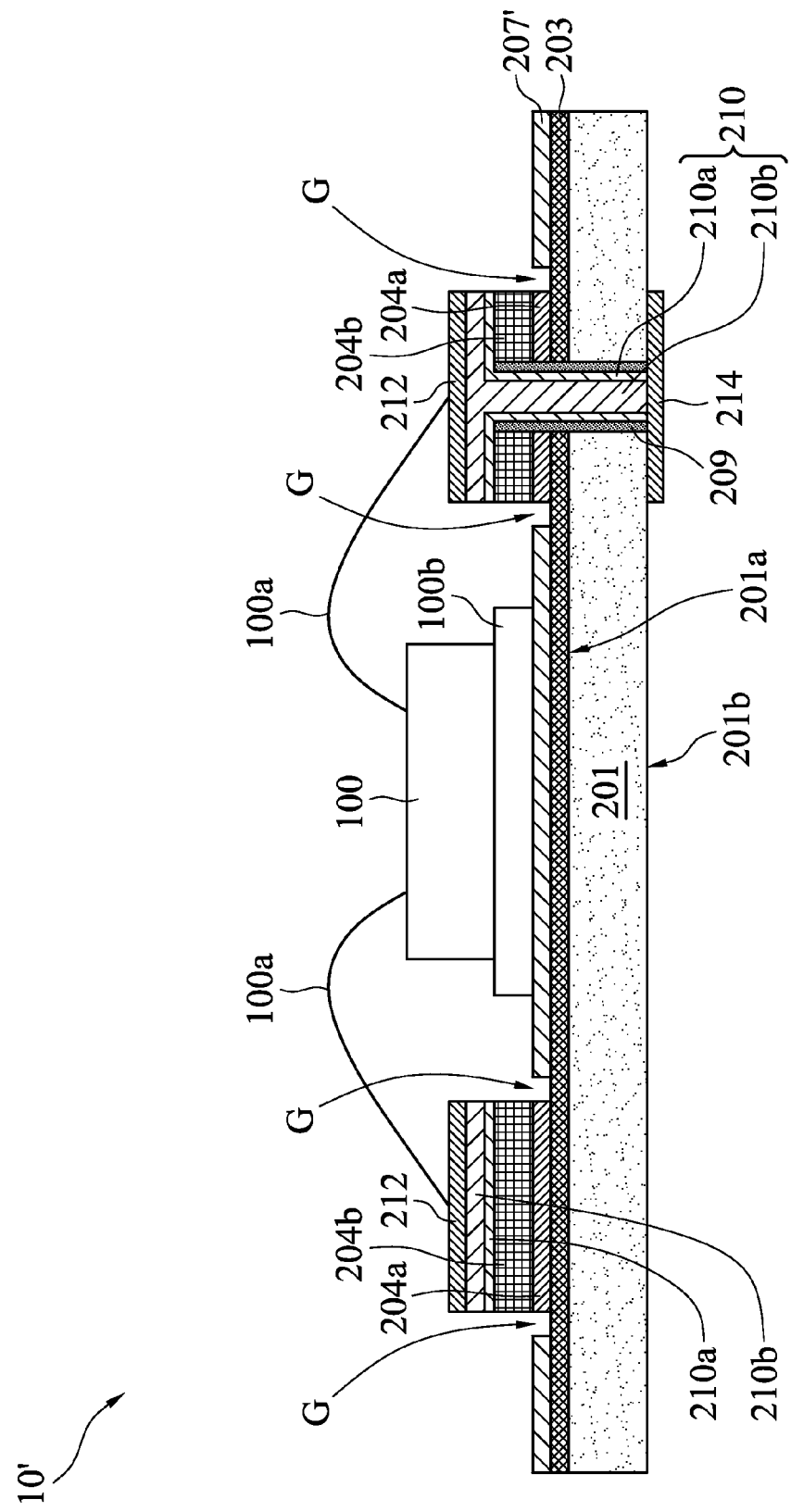

Referring to FIG. 1, which is a cross section of an exemplary embodiment of an electronic package having a heat dissipation structure for an electronic device according to the disclosure. In FIG. 1, the electronic package 10 comprises a heat dissipation structure and an electronic device 100 disposed on the heat dissipation structure. In the embodiment, the heat dissipation structure comprises a body 201, a silicon-containing insulating layer 203, an ultrananocrystalline diamond (UNCD) film 207, a first conductive pattern layer, and a second conductive pattern layer 214. The body 201 has a first surface 201a (e.g., an upper surface) and a second surface 201b (e.g., a bottom surface) opposite to the first surface 201a. In one embodiment, the body 201 may be a package substrate or a circuit board and formed of semiconductor material (e.g., silicon, silicon germanium, gallium nitride, or gallium phosphide), ceramic or polymer. In another embodiment, the body 201 may be a semiconductor chip comprising at least one semiconductor device and at least one interconnect structure therein, in which the interconnect structure is electrically connected to the semiconductor device.

The silicon-containing insulating layer 203, such as silicon nitride, tetraethylorthosilicate (TEOS) oxide or silicon dioxide, is disposed on the first surface 201a of the body 201. Particularly, the UNCD film 207 and the first conductive pattern layer are disposed on the silicon-containing insulating layer 203, in which the first conductive pattern layer is enclosed by the UNCD film 207. Moreover, the UNCD film 207 and the first conductive pattern layer do not overlap with each other as viewed from a top-view perspective.

In the embodiment, the UNCD film 207 serves as a thermally conductive electrically insulating layer. Moreover, the first conductive pattern layer mainly comprises a barrier layer 204a and a conductive layer 204b. Additionally, an additional conductive structure, such as a stack of a barrier layer 210a and conductive layers 210b and 212, may be formed on the conductive layer 204b. In one embodiment, the conductive layers 204b and 210b may comprise plating copper, and the barrier layers 204a and 210a may comprise TiW/Cu and serve as the seed layers for the conductive layers 204b and 210b, respectively. Moreover, the conductive layer 212 may comprise copper, tin or other well known solder materials.

The second conductive pattern layer 214 is disposed on the second surface 201b of the body 201 and may comprise the same or similar materials as that of the conductive layer 212. Moreover, the body 201 may comprise at least one through via 210 therein, formed of the barrier layer 210a and the conductive layer 210b, and insulated from the body 201 by an insulating layer 209. In the embodiment, the insulating layer 209 may comprise silicon nitride, silicon dioxide or UNCD. Moreover, the through via 210 extends from the second surface 210b of the body 201 into the first conductive pattern layer for electrically connection between the first conductive pattern layer and the second conductive pattern layer 214. Note that the second conductive pattern layer 214, the through via 210, the first conductive pattern layer and the UNCD film 207 form a heat dissipation path.

The electronic device 100, such as a light-emitting diode (LED) chip or other semiconductor chips, is attached onto the UNCD film 207 by an adhesion layer 100b and is electrically connected to the first conductive pattern layer under the conductive layer 212 by a wire 100a using a wire bonding process.

Figure 2:
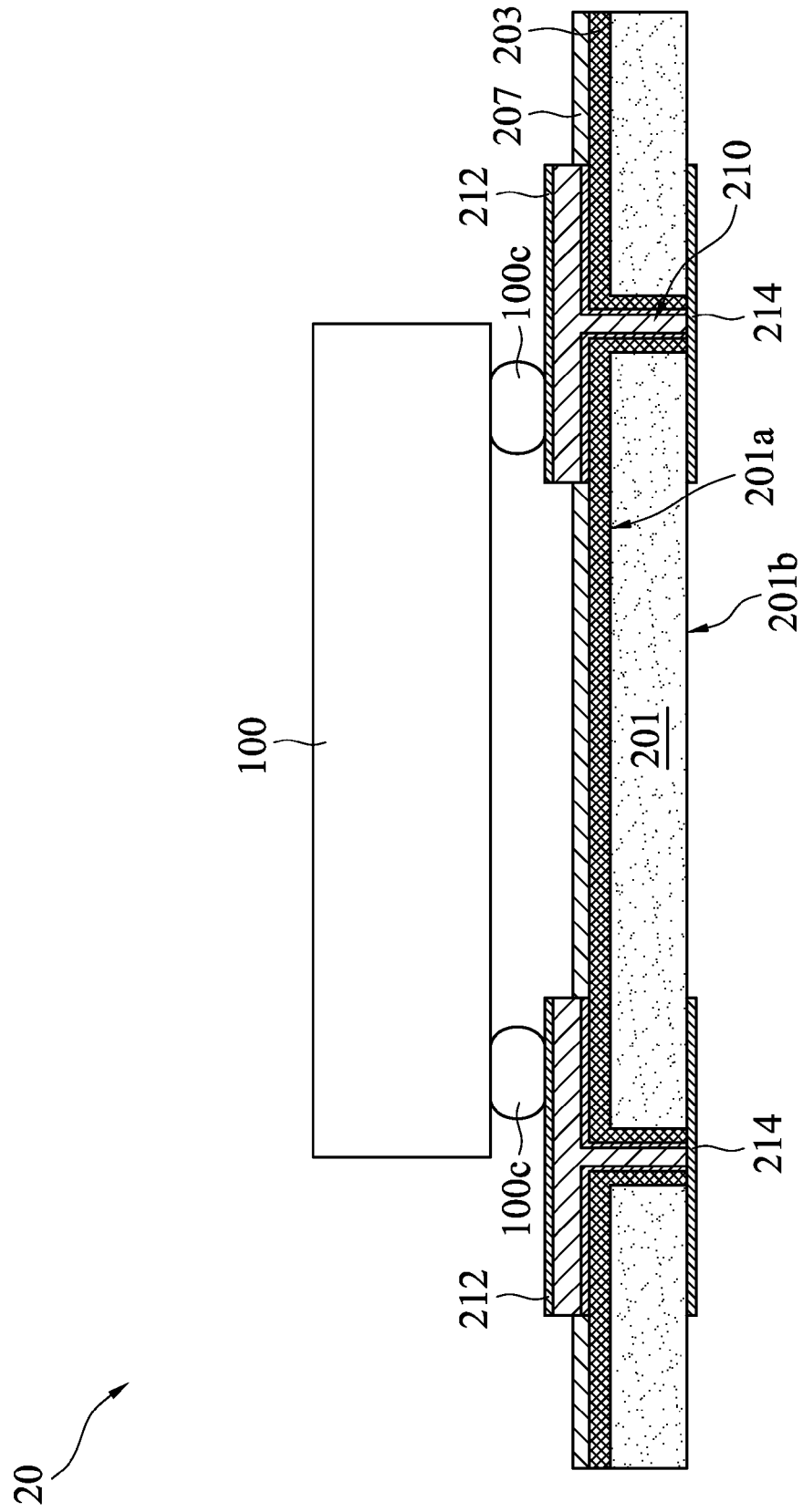
Figures 1, 2:
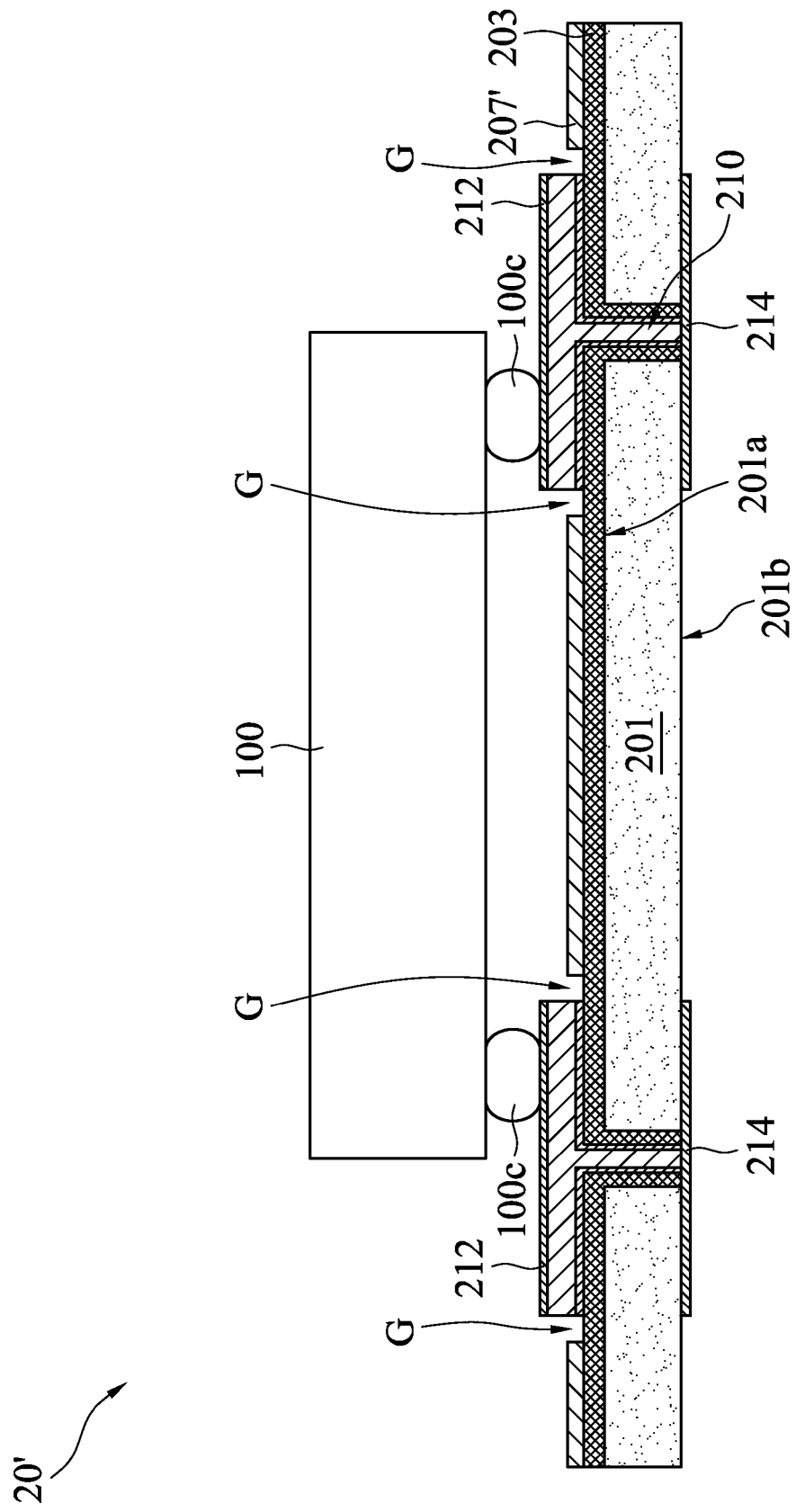

Referring to FIG. 2, which is a cross section of another exemplary embodiment of an electronic package having a heat dissipation structure for an electronic device according to the disclosure. Elements in FIG. 2 that are the same as those in FIG. 1 are labeled with the same reference numbers as in FIG. 1 and are not described again for brevity. In the embodiment, the electronic device 100 in the electronic package 20 is disposed on the first conductive pattern layer. The electronic device 100 is electrically connected to the first conductive pattern layer under the conductive layer 212 by bumps 100c using a flip chip process and is electrically connected to the second conductive pattern layer 214 by the corresponding through vias 210.

Figure 3:
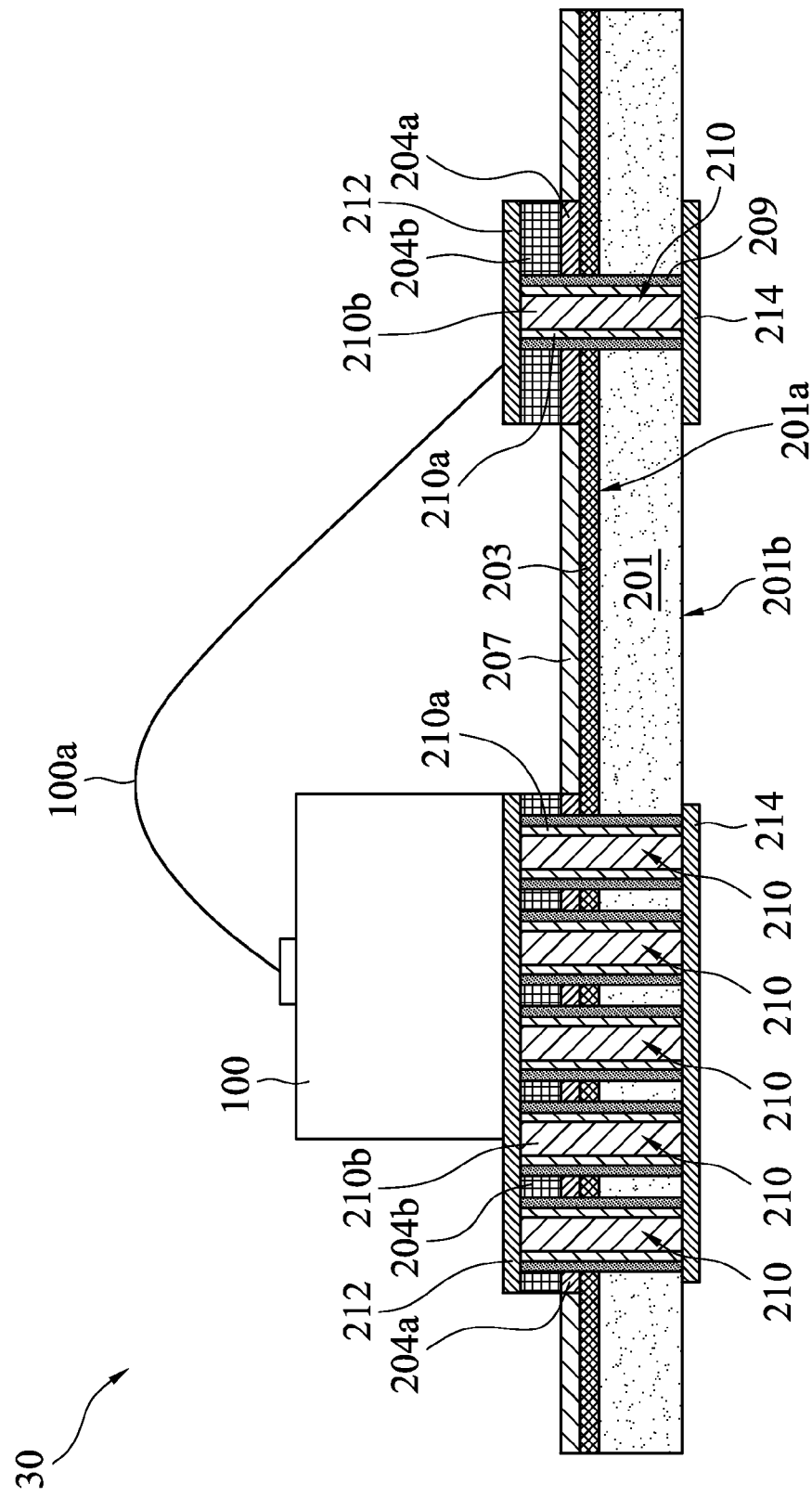
Figures 1, 3:
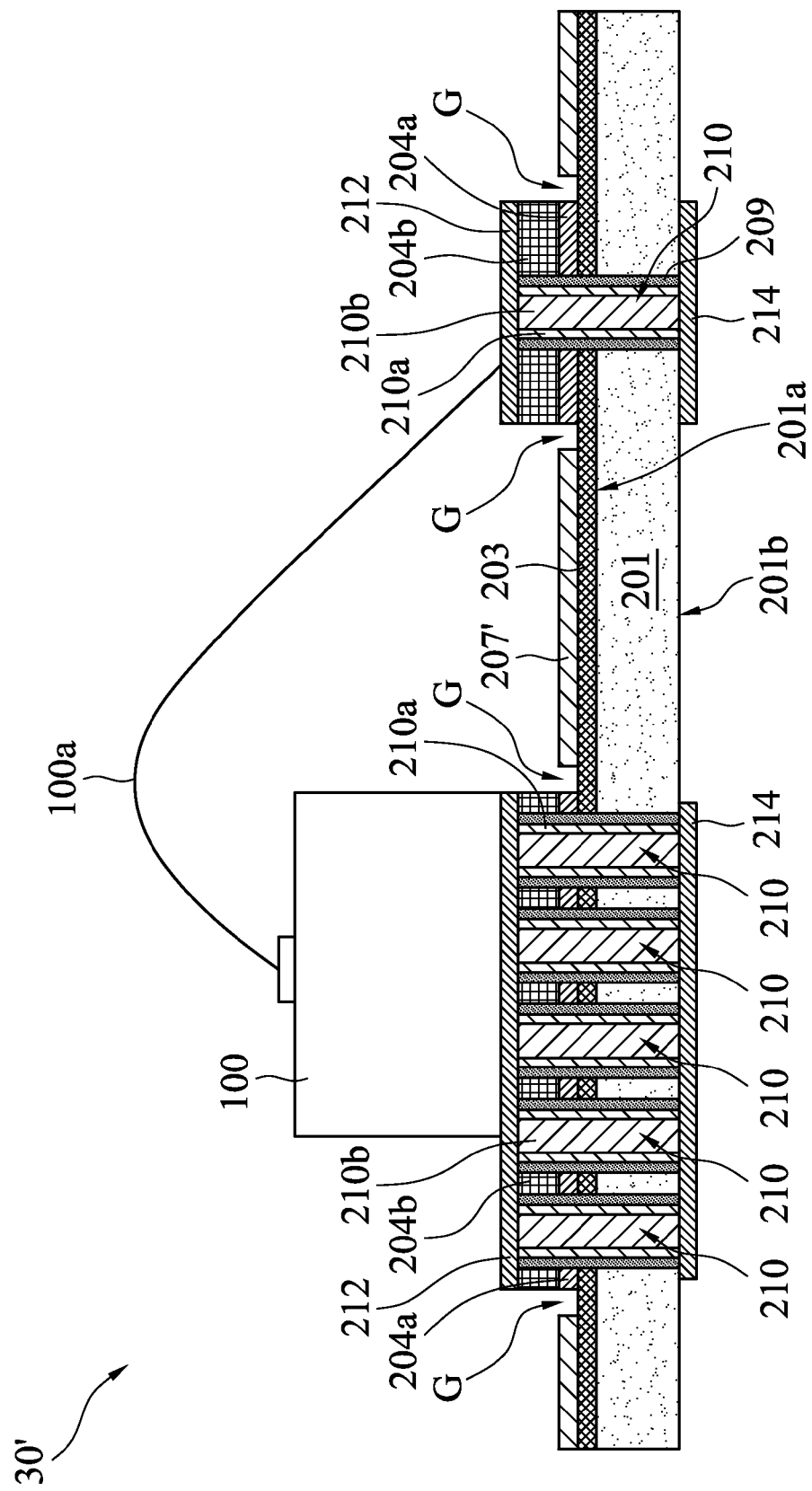

Referring to FIG. 3, which is a cross section of yet another exemplary embodiment of an electronic package having a heat dissipation structure for an electronic device according to the disclosure. Elements in FIG. 3 that are the same as those in FIG. 1 are labeled with the same reference numbers as in FIG. 1 and are not described again for brevity. In the embodiment, the electronic device 100 in the electronic package 30 is disposed on the conductive layer 212 above the first conductive pattern layer. The electronic device 100 is electrically connected to the first conductive pattern layer under the conductive layer 212 by a wire 100a and bumps (not shown) and is electrically connected to the second conductive pattern layer 214 by corresponding through vias 210.

Referring to FIGS. 1-1, 2-1 and 3-1, which are cross sections of various exemplary embodiments of an electronic package having a heat dissipation structure for an electronic device according to the disclosure. Elements in FIGS. 1-1, 2-1, and 3-1 that are the same as those in FIGS. 1, 2, and 3, respectively, are labeled with the same reference numbers as in FIGS. 1, 2, and 3, respectively, and are not described again for brevity. In FIG. 1-1, the electronic package 10' has a similar structure as the electronic package 10 shown in FIG. 1. Unlike the electronic package 10 of FIG. 1, the electronic package 10' comprises a chemical vapor deposition (CVD) diamond film 207' serving as a thermally conductive layer. In the embodiment, the CVD diamond film 207' and the first conductive pattern layer are disposed on the silicon-containing insulating layer 203, in which the first conductive pattern layer is enclosed by and spaced apart from the CVD diamond film 207'. Namely, gaps G are formed between the CVD diamond film 207' and the first conductive pattern layer. Since, the CVD diamond film 207' is electrically conductive, the CVD diamond film 207' can be electrically insulated from the first conductive pattern layer by the gaps G.

In FIG. 2-1, the electronic package 20' has a similar structure as the electronic package 20 shown in FIG. 2. Unlike the electronic package 20 of FIG. 2, the electronic package 20' comprises a CVD diamond film 207'. In the embodiment, the CVD diamond film 207' and the first conductive pattern layer are disposed on the silicon-containing insulating layer 203, in which the first conductive pattern layer is enclosed by and spaced apart from the CVD diamond film 207'.

In FIG. 3-1, the electronic package 30' has a similar structure as the electronic package 30 shown in FIG. 3. Unlike the electronic package 30 of FIG. 3, the electronic package 30' comprises a CVD diamond film 207'. In the embodiment, the CVD diamond film 207' and the first conductive pattern layer are disposed on the silicon-containing insulating layer 203, in which the first conductive pattern layer is enclosed by and spaced apart from the CVD diamond film 207'.

Figure 4A:
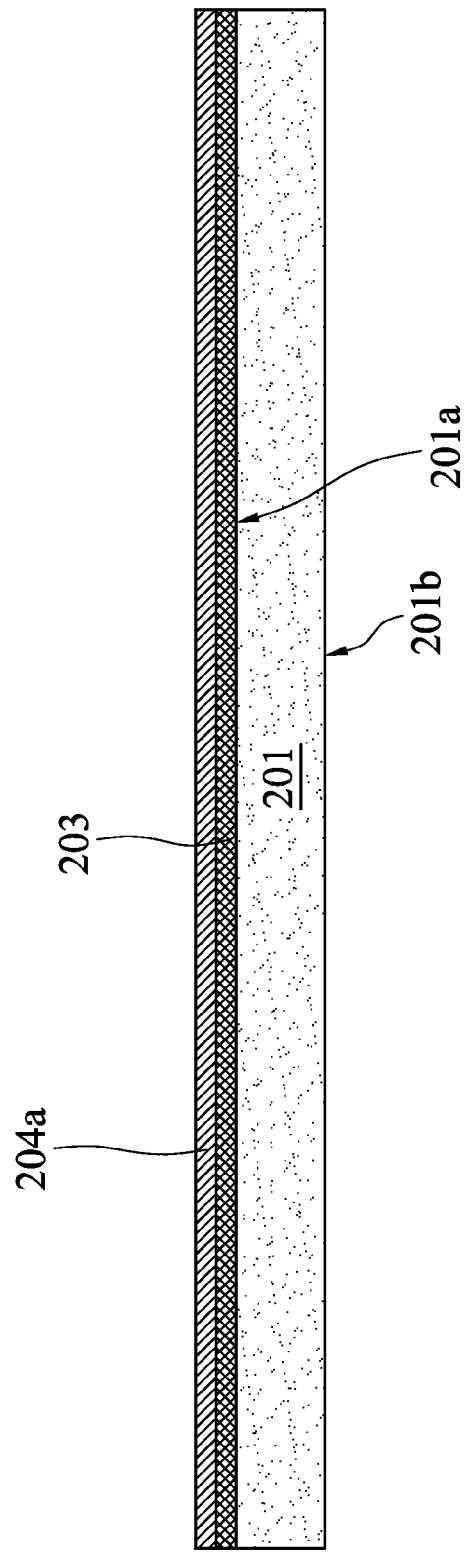
FIGS. 4A to 4J are cross sections of an exemplary embodiment of a method for fabricating a heat dissipation structure for an electronic device according to the disclosure.

FIGS. 4A to 4J are cross sections of an exemplary embodiment of a method for fabricating a heat dissipation structure for an electronic device according to the disclosure. Elements in FIGS. 4A to 4J that are the same as those in FIGS. 1 to 3 are labeled with the same reference numbers as in FIGS. 1 to 3. Referring to FIG. 4A, a body 201 having a first surface 201a (e.g., an upper surface) and a second surface 201b (e.g., a bottom surface) opposite to the first surface 201a is provided. In the embodiment, the body 201 may be a package substrate or a circuit board and formed of semiconductor material (e.g., silicon, silicon germanium, gallium nitride, or gallium phosphide), ceramic or polymer. Next, a silicon-containing insulating layer 203, such as silicon nitride, TEOS oxide, or silicon dioxide, is formed on the first surface 201a of the body 201 by a thermal oxidation or deposition (e.g., chemical vapor deposition (CVD)) process. Thereafter, a barrier layer 204a, such as TiW/Cu or other well known metal barrier materials, is blanket-like deposited on the silicon-containing insulating layer 203 by a sputtering process or other suitable deposition processes. In the embodiment, the barrier layer 204a serves as a seed layer for the subsequent metal plating process.

Figure 4B:
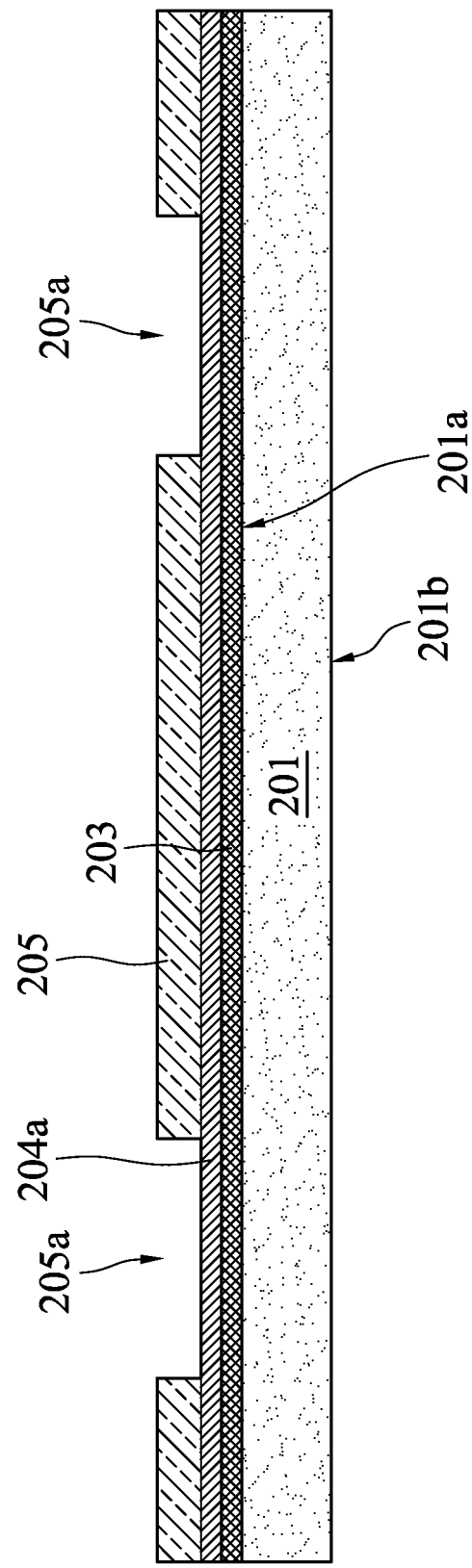
Figure 4C:
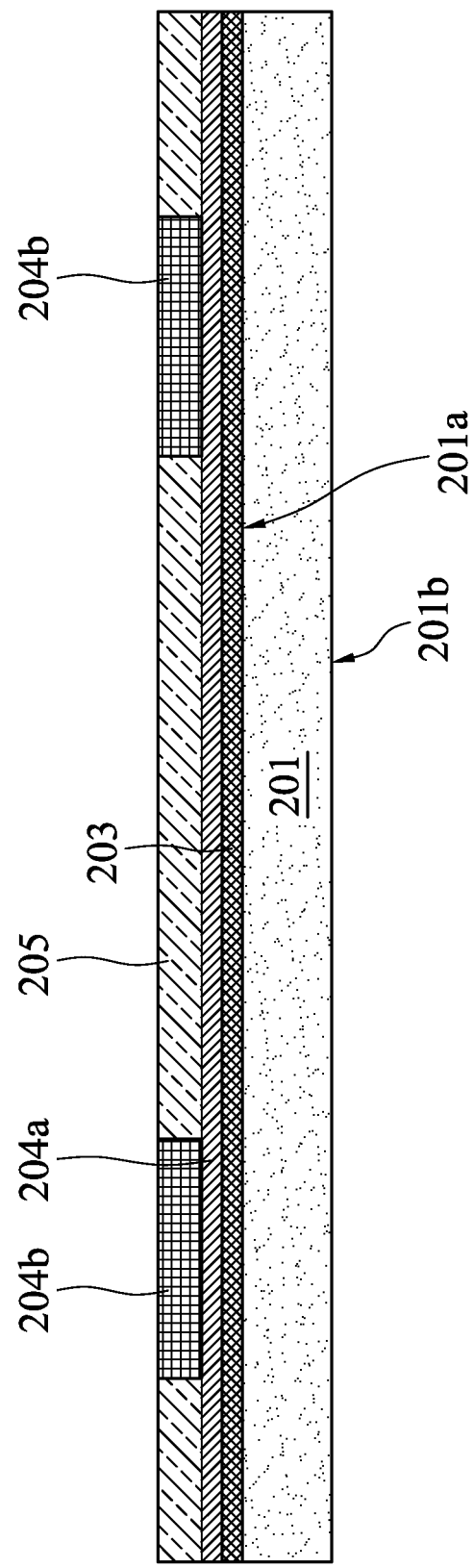

Referring to FIG. 4B, a photoresist layer 205 is formed on the barrier layer 204a. Thereafter, an opening pattern 205a is formed in the photoresist layer 205 by the conventional lithography process to partially expose the barrier layer 204a, thereby fabricating a conductive pattern layer following subsequent processes. Referring to FIG. 4C, a conductive layer 204b is filled into the opening pattern 205a. For example, the conductive layer 204b is formed by a plating process using the exposed barrier layer 204a as a seed layer.

Figure 4D:
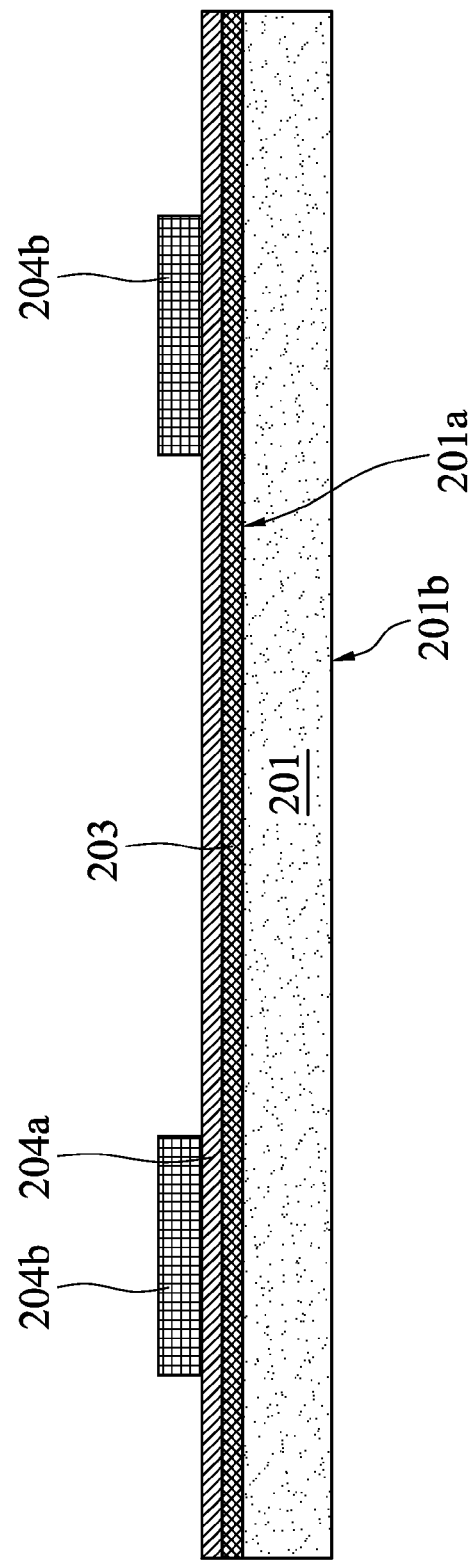
Figure 4E:
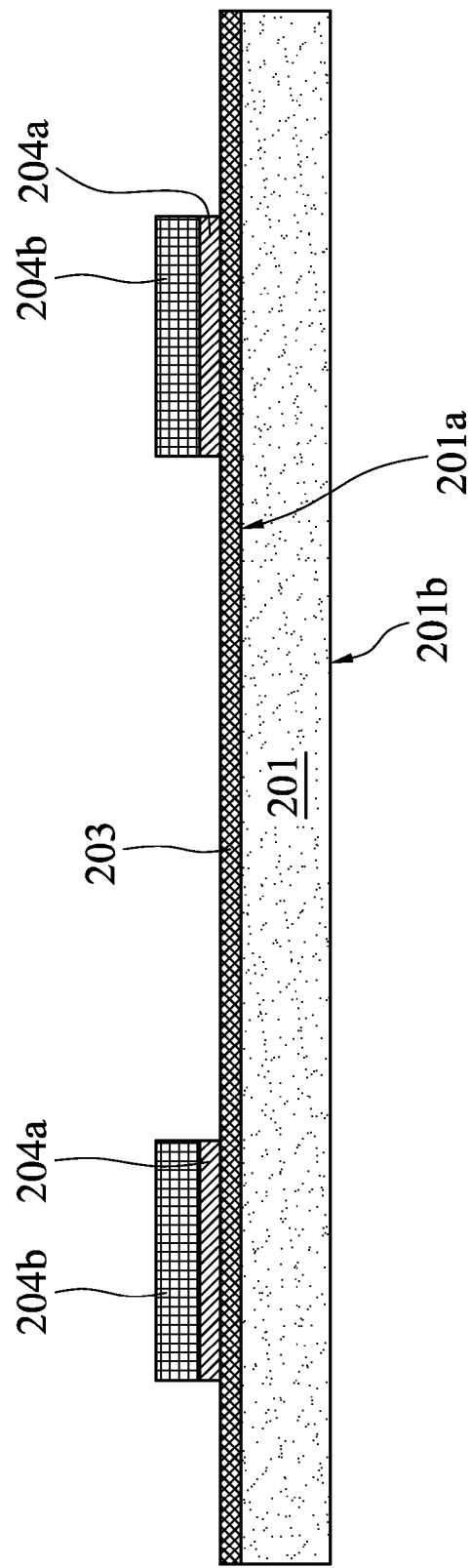

Thereafter, the photoresist layer 205 and the barrier layer 204a thereunder are removed successively to form a first conductive pattern layer (comprising the barrier layer 204a and the conducive layer 204b), while partially exposing the silicon-containing insulating layer 203, as shown in FIGS. 4D and 4E, respectively.

Figure 4F:
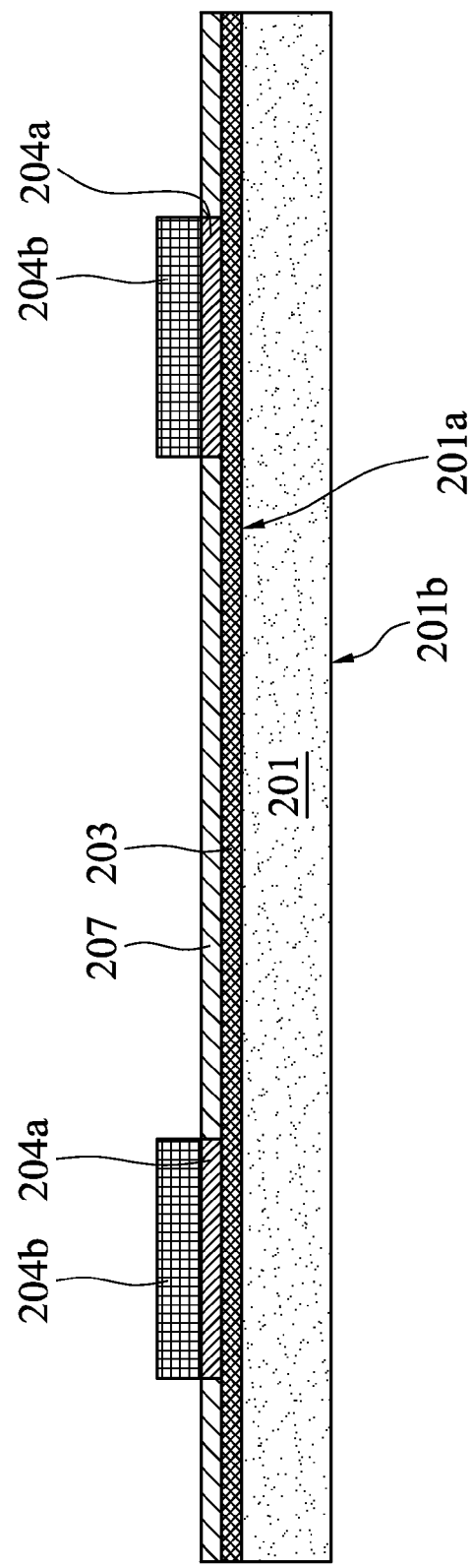

Referring to FIG. 4F, a UNCD film 207 is formed on the exposed silicon-containing insulating layer 203, such that the first conductive pattern layer is substantially enclosed by the UNCD film 207, and the UNCD film 207 and the first conductive pattern layer do not overlap with each other as viewed from a top-view perspective. For example, the UNCD film 207 is formed by a CVD process using Argon and methane ($CH_4$) as process gases, in which the process pressure may be in a range of about 90 torr to 120 torr, and the process temperature may be in a range of about 450° C. to 500° C. Since the UNCD film 207 has good conformity, the exposed silicon-containing insulating layer 203 can be entirely covered by the UNCD film 207 and the UNCD film 207 is attached onto sidewalls of the first conductive pattern layer, and therefore, a good passivation and thermally conductive-electrically insulated layer can be formed.

Figure 4G:
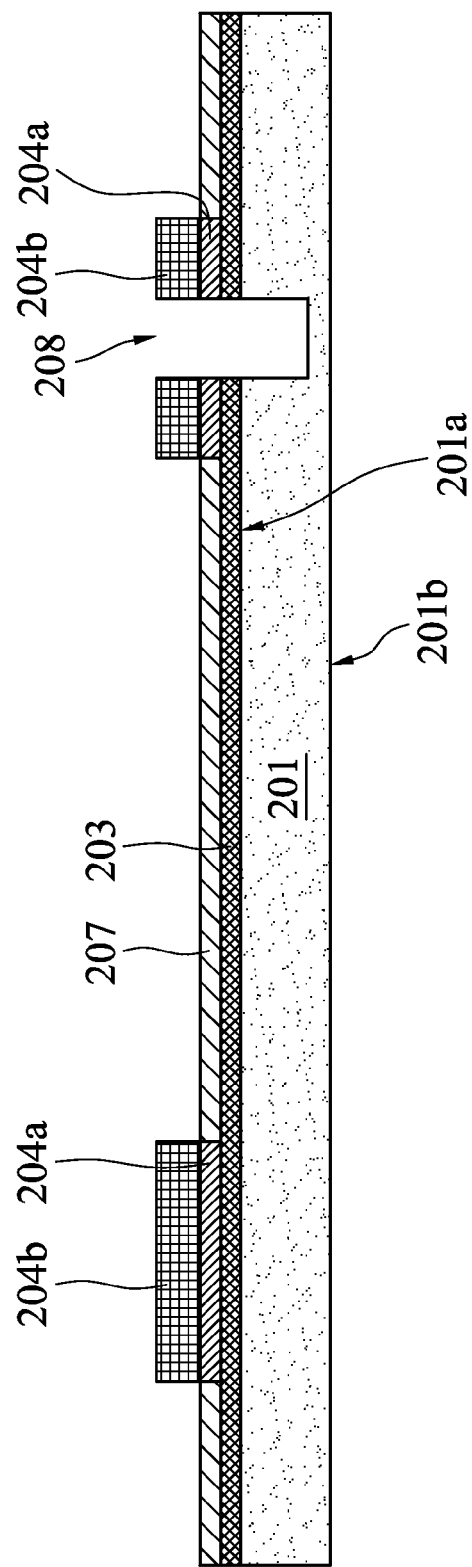

Referring to FIG. 4G, at least one opening 208 is formed in the first conductive pattern layer by a conventional etching process, such as a dry etching process, and extends into a portion of the body 201 for fabricating a through via during subsequent processes.

Figure 4H:
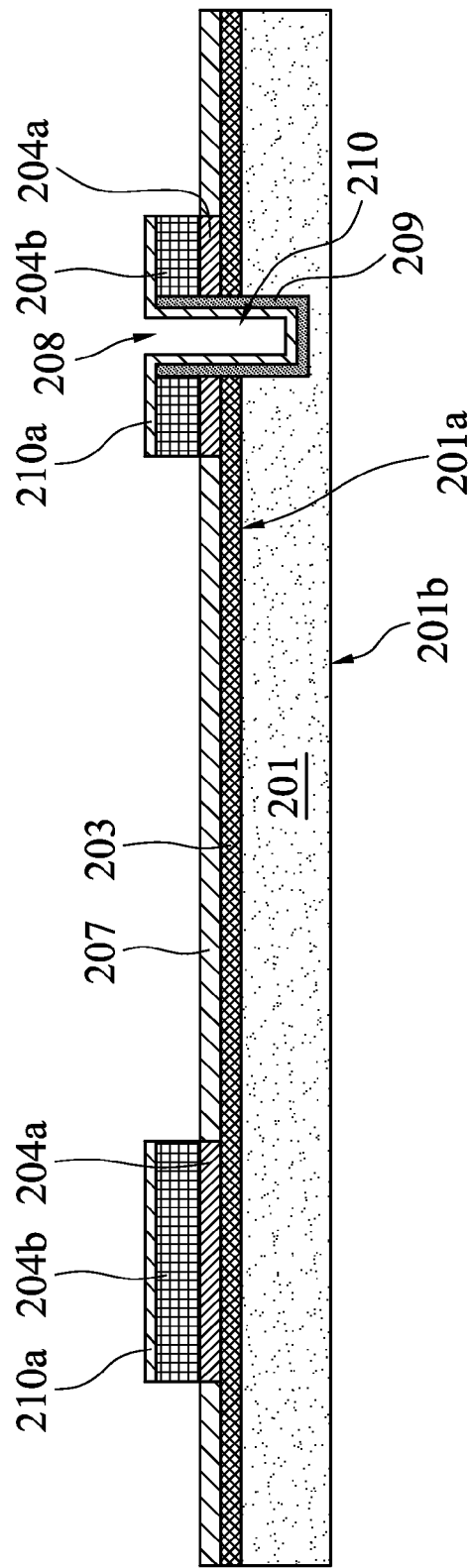

Referring to FIG. 4H, an insulating layer 209, such as silicon nitride, silicon dioxide, or UNCD, is formed on sidewalls and a bottom of the opening 208. Thereafter, a barrier layer 210a, serving as a seed layer, is formed on the first conductive pattern layer and covers the insulating layer 209 on the sidewalls and the bottom of the opening 208. The barrier layer 210a may comprise the same or similar materials as that of barrier layer 204a.

Figure 4I:
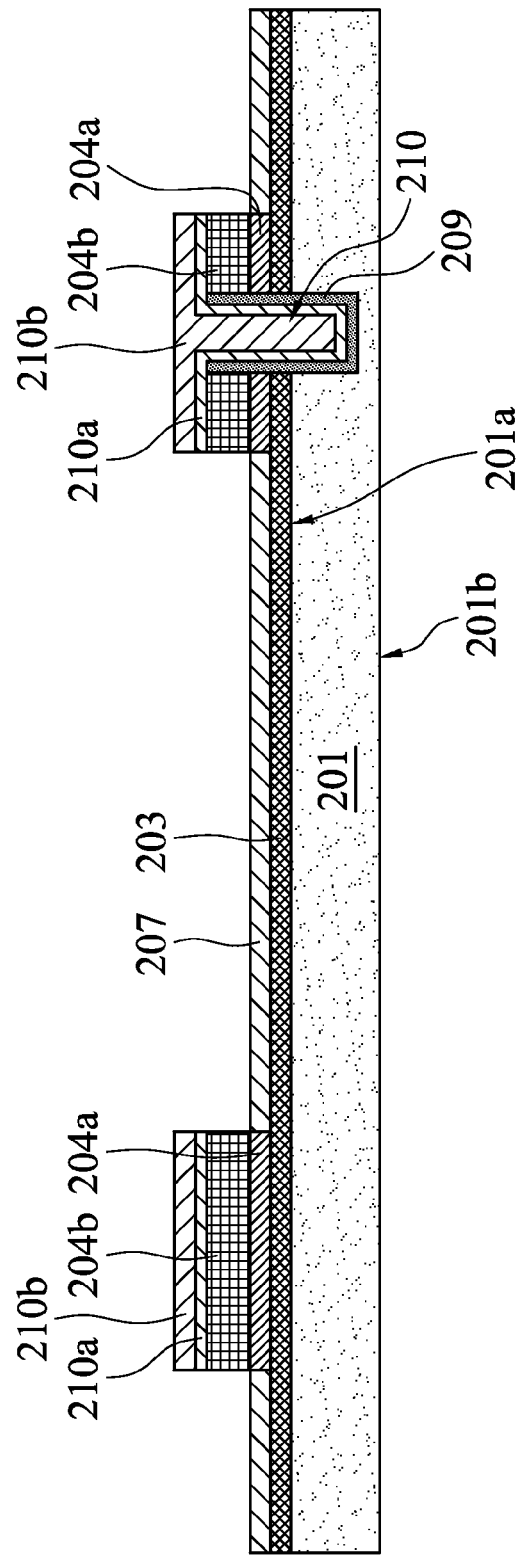

Referring to FIG. 4I, a conductive layer 210b is formed on the barrier layer 210a on the first conductive pattern layer and fills the opening 208 (shown in FIG. 4H) by a plating process or other suitable deposition processes.

Figure 4J:
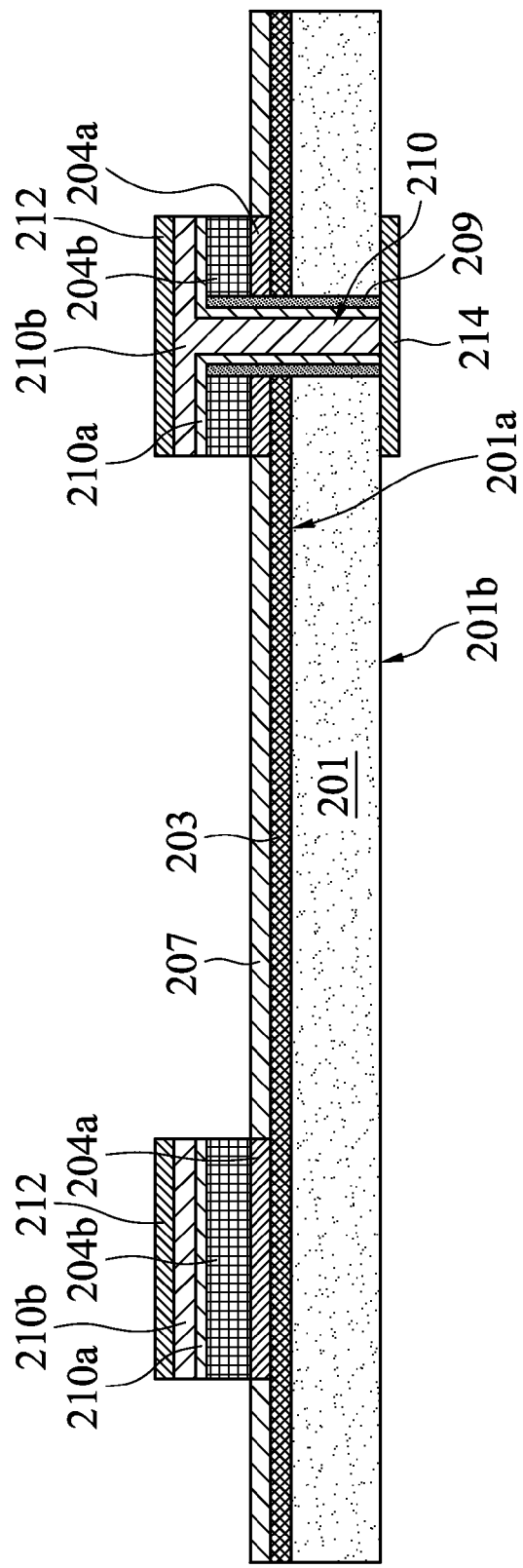

Referring to FIG. 4J, a thinning process, such as a chemical mechanical polishing (CMP) or etching process may be performed to remove a portion of the body 201 from the second surface 201b of the body 201 until the conductive layer 210b in the opening 208 (shown in FIG. 4H) of the body 201 is exposed, thereby forming a through via 210 (i.e., the barrier layer 210a and the conductive layer 210b in the opening 208) in the body 201. In the embodiment, the through via 210 extends from the second surface 201b of the body 201 into the first conductive pattern layer. Finally, a conductive layer 212 is formed on the first conductive pattern layer by a plating process, while a second conductive pattern layer 214 is formed on the second surface 201b of the body 201, in which the second conductive pattern layer 214 is electrically connected to the first conductive pattern layer by the through via 210. As a result, the formation of the heat dissipation structure of the embodiment is completed. In one embodiment, the conductive layer 212 and the second conductive pattern layer 214 may comprise the same material (e.g., copper, tin or other well known solder materials) and simultaneously formed of by a plating process. In another embodiment, the conductive layer 212 and the second conductive pattern layer 214 may comprise different conductive materials. Such a heat dissipation structure may further be mounted under an electronic device 100 (e.g., LED chip or other semiconductor chips) to form an electronic package with a heat dissipation structure, as shown in FIG. 1.

Figure 8A:
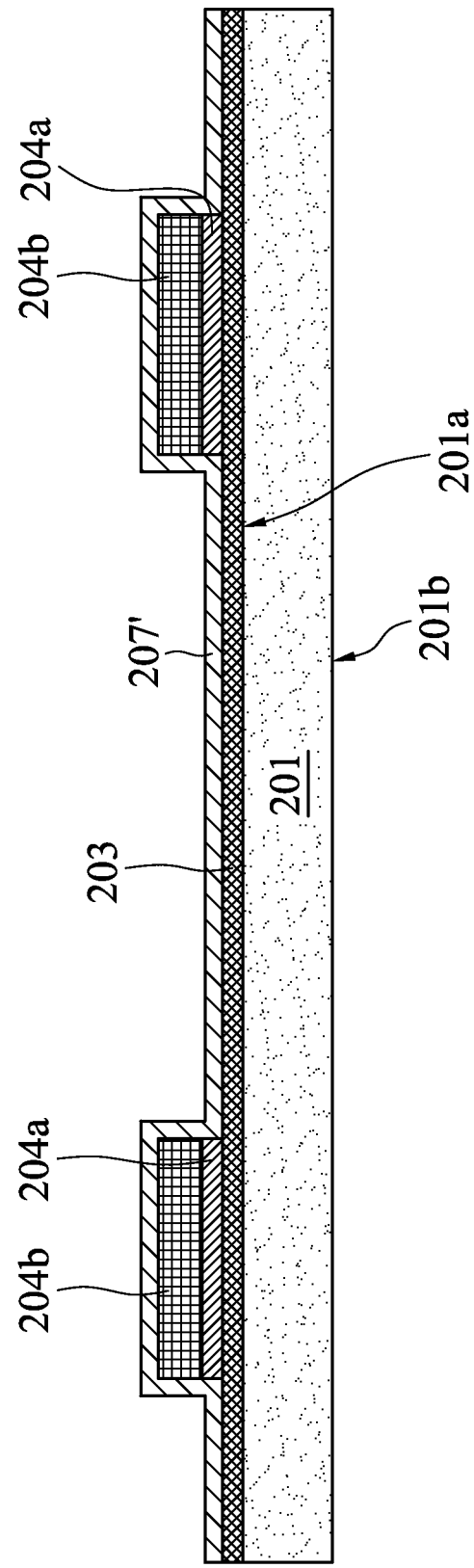
FIGS. 8A to 8D are cross sections of an exemplary embodiment of intermediate stages of a method for fabricating the heat dissipation structure shown in FIG. 1-1.

In some embodiments, a CVD diamond film can be used instead of the UNCD film 207 in the heat dissipation structure to serve as a good passivation and thermally conductive layer. Also, such a heat dissipation structure may further be mounted under an electronic device 100 to form an electronic package with the heat dissipation structure, as shown in FIG. 1-1. Referring to FIGS. 8A to 8D, which illustrates intermediate stages of a method for fabricating the heat dissipation structure shown in FIG. 1-1. In FIG. 8A, a structure as shown in FIG. 4E is provided. A CVD diamond film 207' is subsequently and conformally formed on the surfaces of the first conductive pattern layer (comprising the barrier layer 204a and the conducive layer 204b) and the silicon-containing insulating layer 203. In one embodiment, the CVD diamond film 207' may be formed by a CVD process using oxygen-containing gas (e.g., $O_2$, CO, $CO_2$) and $CF_4$ gas as process gases, in which the process pressure may be in 50 mTorr.

Figure 8B:
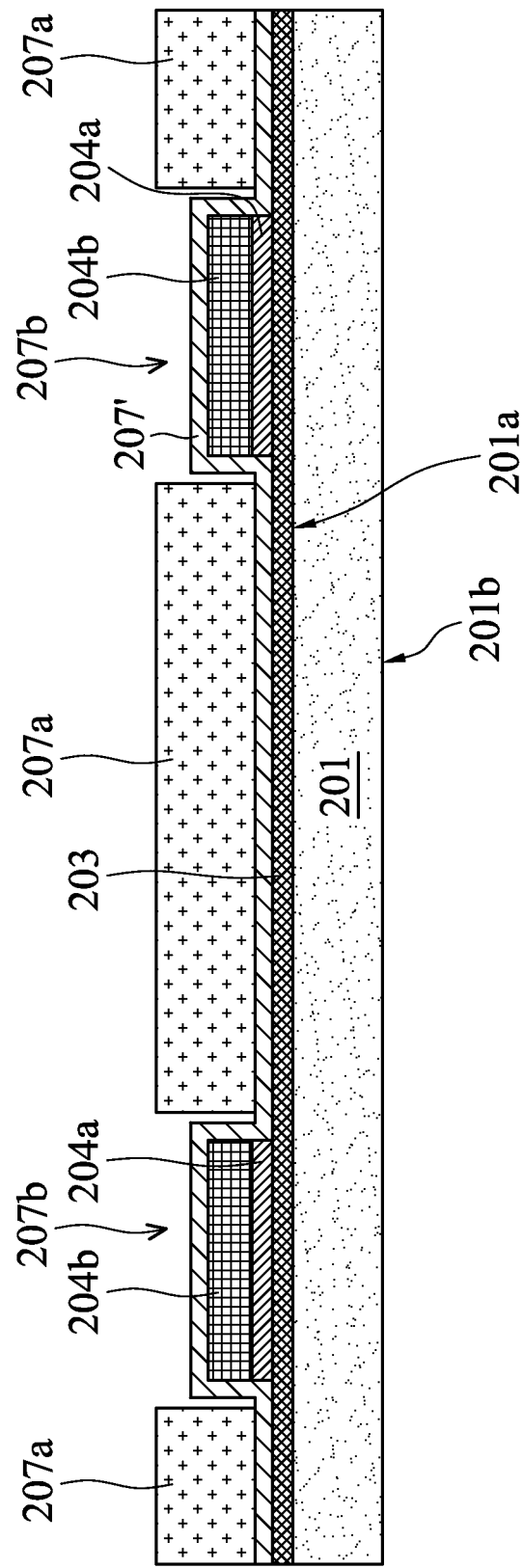

In FIG. 8B, a masking layer 207a with openings 207b is formed on the CVD diamond film 207', in which portions of the CVD diamond film 207' covering the surfaces of the first conductive pattern layer are exposed through the openings 207b. The masking layer 207a may comprise aluminum or other suitable metal materials.

Figure 8C:
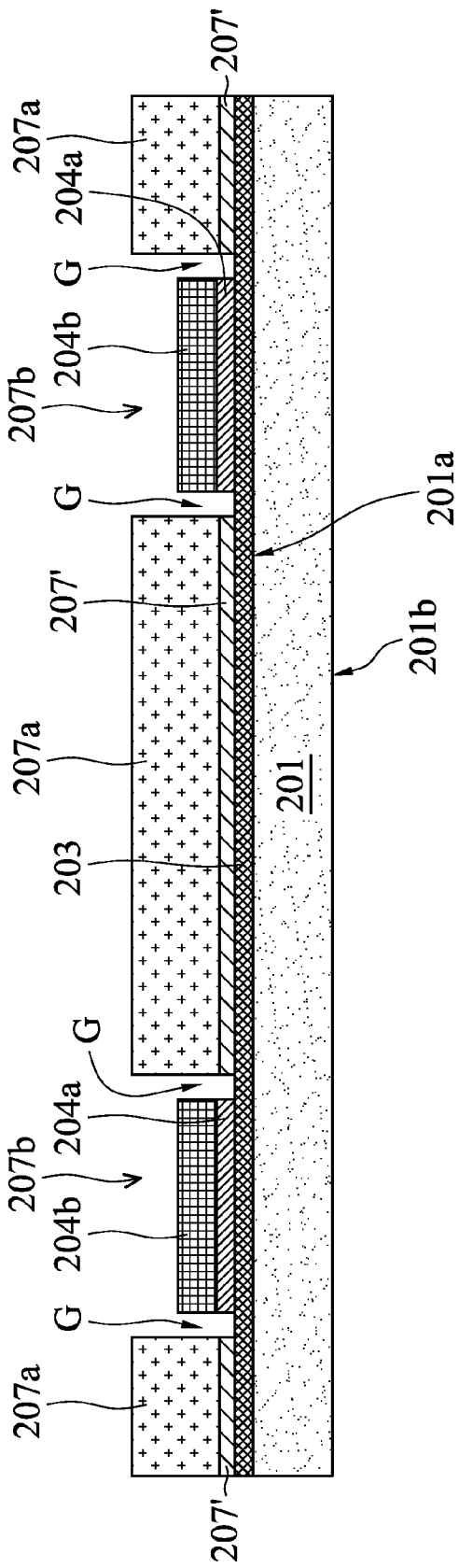
Figure 8D:
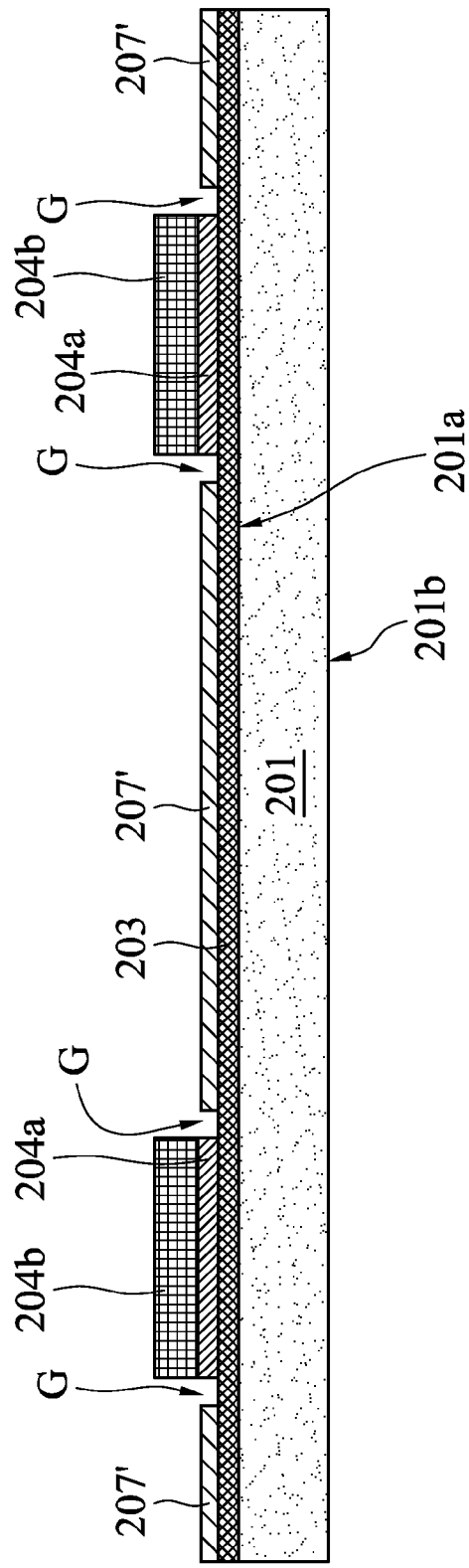

In FIG. 8C, the exposed CVD diamond film 207' in the openings 207b is removed by an etching process, such as reactive ion etching (RIE), using the masking layer 207a as an etch mask, such that the CVD diamond film 207' under the masking layer 207a is spaced apart from the first conductive pattern layer by gaps G. Thereafter, the masking layer 207a is removed, as shown in FIG. 8D. The process steps shown in FIGS. 4G to 4J may be performed sequentially on the structure shown in the FIG. 8D, to complete a heat dissipation structure. The heat dissipation structure may further be mounted under an electronic device 100 to form the electronic package 10' shown in FIG. 1-1.

Figure 5A:
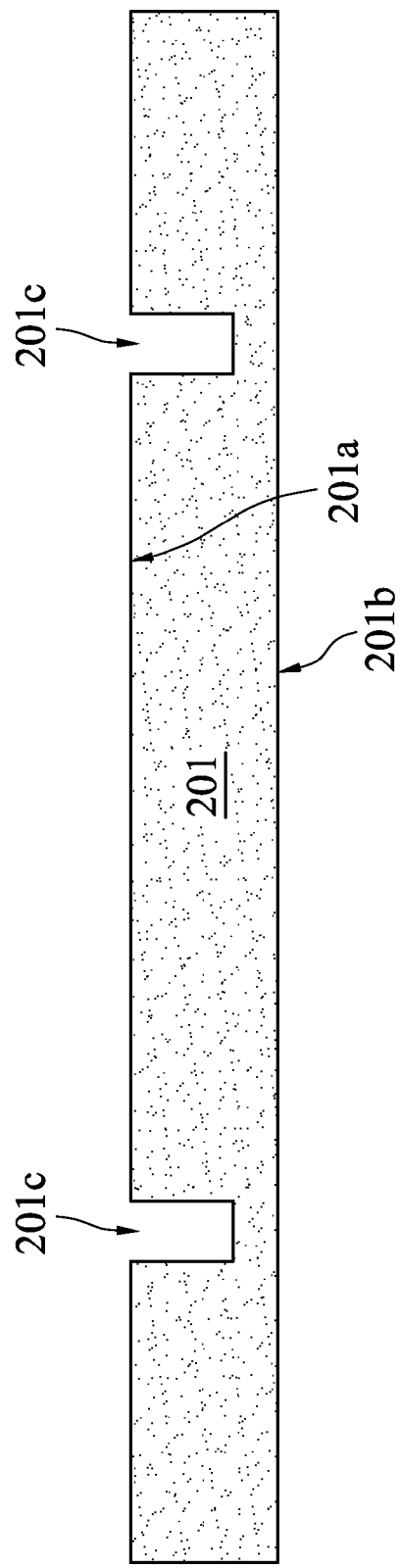
FIGS. 5A to 5F are cross sections of another exemplary embodiment of a method for fabricating a heat dissipation structure for an electronic device according to the disclosure.

FIGS. 5A to 5F are cross sections of another exemplary embodiment of a method for fabricating a heat dissipation structure for an electronic device according to the disclosure. Elements in FIGS. 5A to 5F that are the same as those in FIGS. 4A to 4J are labeled with the same reference numbers as in FIGS. 4A to 4J. Referring to FIG. 5A, a body 201 having a first surface 201a and a second surface 201b opposite to the first surface 201a is provided. At least one opening 201c may be formed in the body 201 by an etching process for fabrication of through via(s) in the subsequent processes. Note that the number of openings 201c is depended on the design demands. In order to simplify the diagram, only two openings 201c are depicted.

Figure 5B:
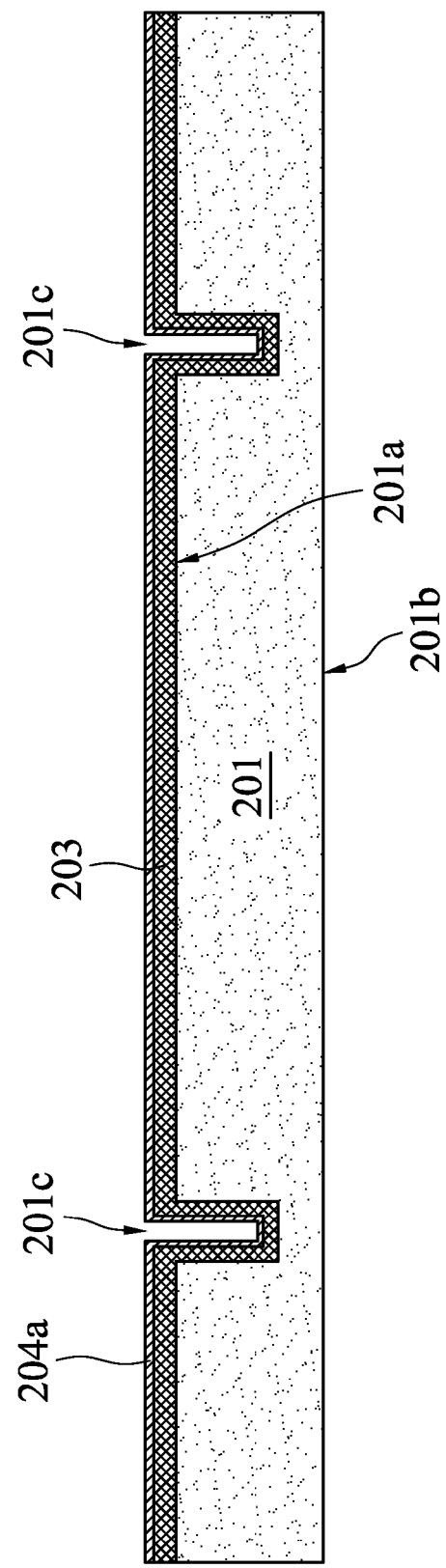

Referring to FIG. 5B, a silicon-containing insulating layer 203 is formed on the first surface 201a of the body 201 and extends on sidewalls and a bottom of each opening 201c. Thereafter, a barrier layer 204a is formed on the silicon-containing insulating layer 203.

Figure 5C:
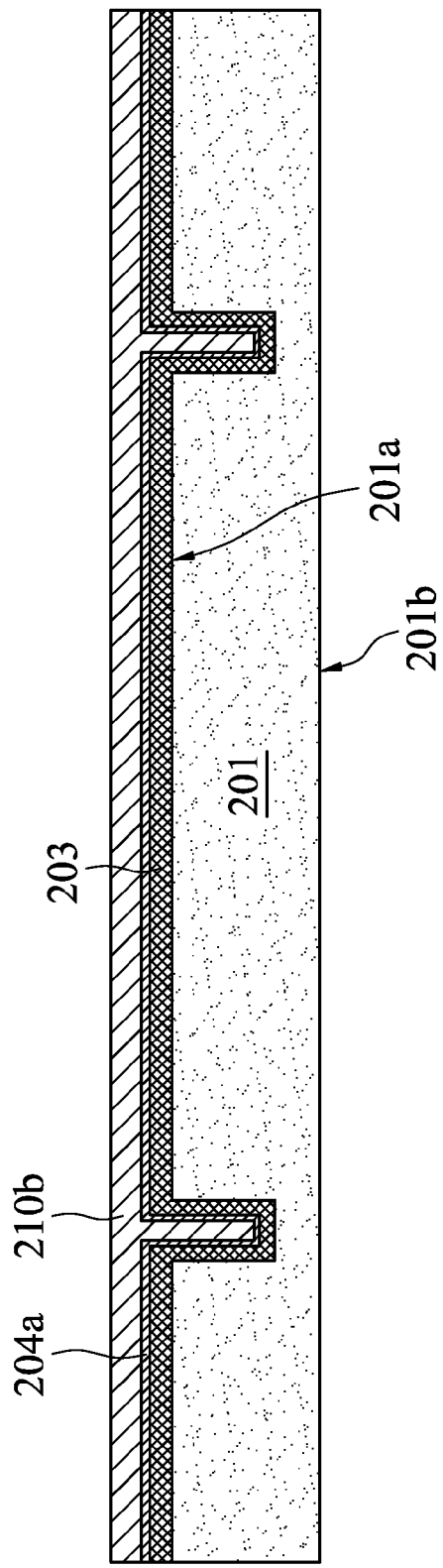
Figure 5D:
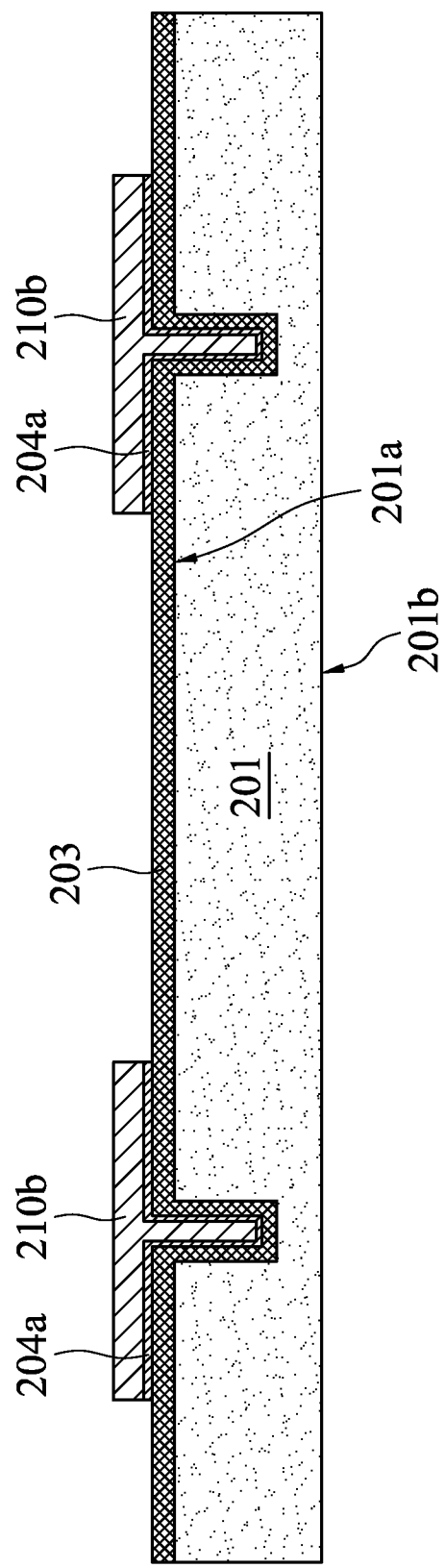

Referring to FIG. 5C, a conductive layer 210b is formed on the barrier layer 204a and fills each openings 201c. Thereafter, the conductive layer 210b and the underlying barrier layer 204a are patterned by a conventional lithography and etching processes, to form a first conductive pattern layer and partially expose the silicon-containing insulating layer 203, as shown in FIG. 5D.

Figure 5E:
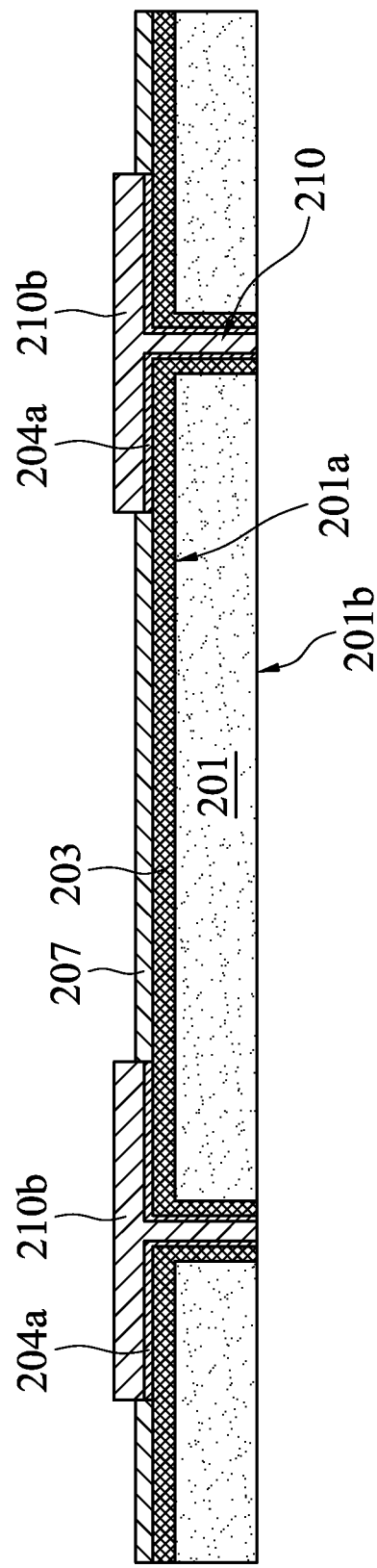

Referring to FIG. 5E, a UNCD film 207 is formed on the exposed silicon-containing insulating layer 203, such that the first conductive pattern layer is substantially enclosed by the UNCD film 207, and the UNCD film 207 and the first conductive pattern layer do not overlap with each other as viewed from a top-view perspective. Next, a thinning process may be performed to remove a portion of the body 201 from the second surface 201b of the body 201 until the barrier layer 204a and the conductive layer 210b in each opening 201c (shown in FIG. 5B) of the body 201 is exposed, thereby forming a through via 210 (i.e., the barrier layer 204a and the conductive layer 210b in each opening 201c) in the body 201.

Figure 5F:
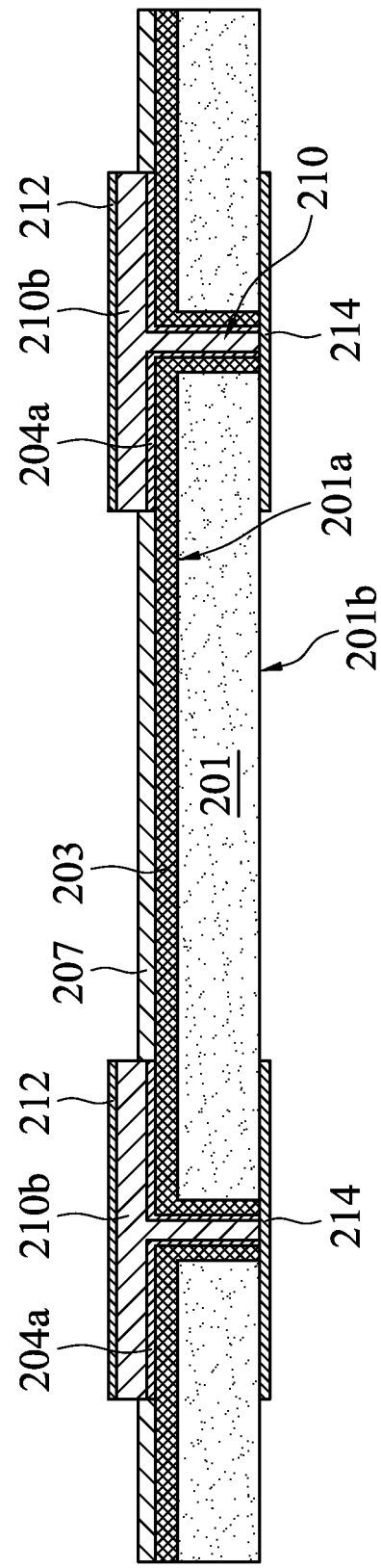

Referring to FIG. 5F, a conductive layer 212 is formed on the first conductive pattern layer by a plating process, while a second conductive pattern layer 214 is formed on the second surface 201b of the body 201, in which the second conductive pattern layer 214 is electrically connected to the first conductive pattern layer by the through via 210. As a result, the formation of the heat dissipation structure of the embodiment is completed. Such a heat dissipation structure may further be mounted under an electronic device 100 (e.g., LED chip or other semiconductor chips) to form an electronic package with a heat dissipation structure, as shown in FIG. 2.

Figure 9A:
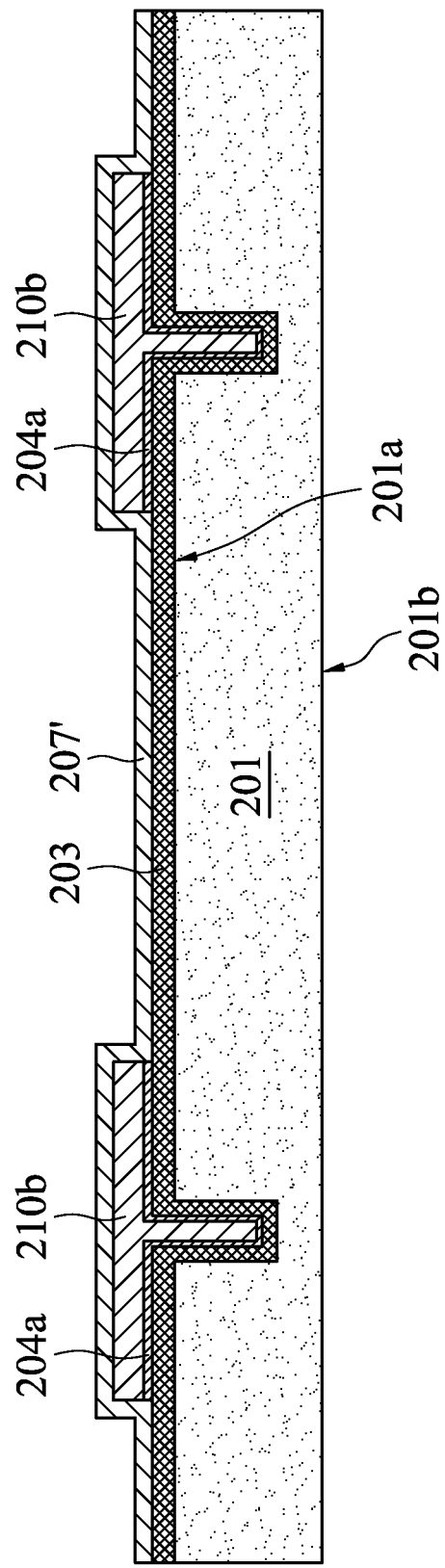
FIGS. 9A to 9D are cross sections of an exemplary embodiment of intermediate stages of a method for fabricating the heat dissipation structure shown in FIG. 2-1.

In some embodiments, a CVD diamond film can be used instead of the UNCD film 207 in the heat dissipation structure. Such a heat dissipation structure may further be mounted under an electronic device 100 to form an electronic package with the heat dissipation structure, as shown in FIG. 2-1. Referring to FIGS. 9A to 9D, which illustrates intermediate stages of a method for fabricating the heat dissipation structure shown in FIG. 2-1. Elements in FIGS. 9A to 9D that are the same as those in FIGS. 8A to 8D are labeled with the same reference numbers as in FIGS. 8A to 8D. In FIG. 9A, a structure as shown in FIG. 5D is provided. A CVD diamond film 207' is subsequently and conformally formed on the surfaces of the first conductive pattern layer (comprising the barrier layer 204a and the conducive layer 210b) and the silicon-containing insulating layer 203.

Figure 9B:
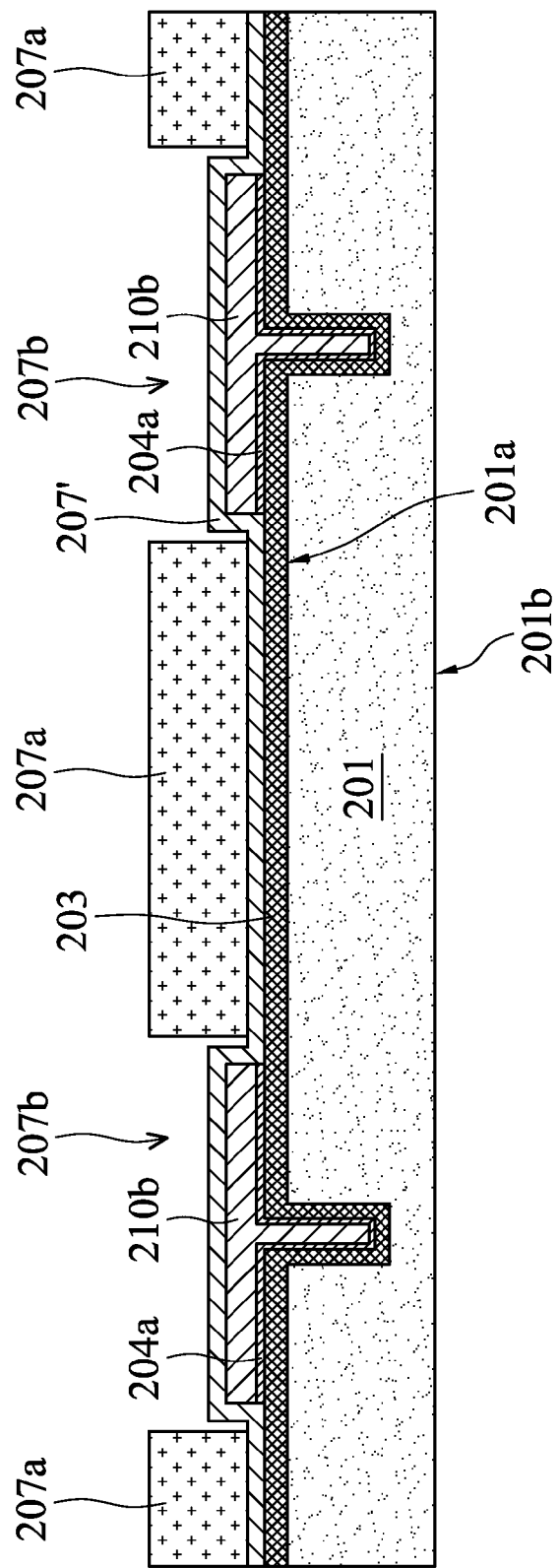

In FIG. 9B, a masking layer 207a with openings 207b is formed on the CVD diamond film 207', in which portions of the CVD diamond film 207' covering the surfaces of the first conductive pattern layer are exposed through the openings 207b.

Figure 9C:
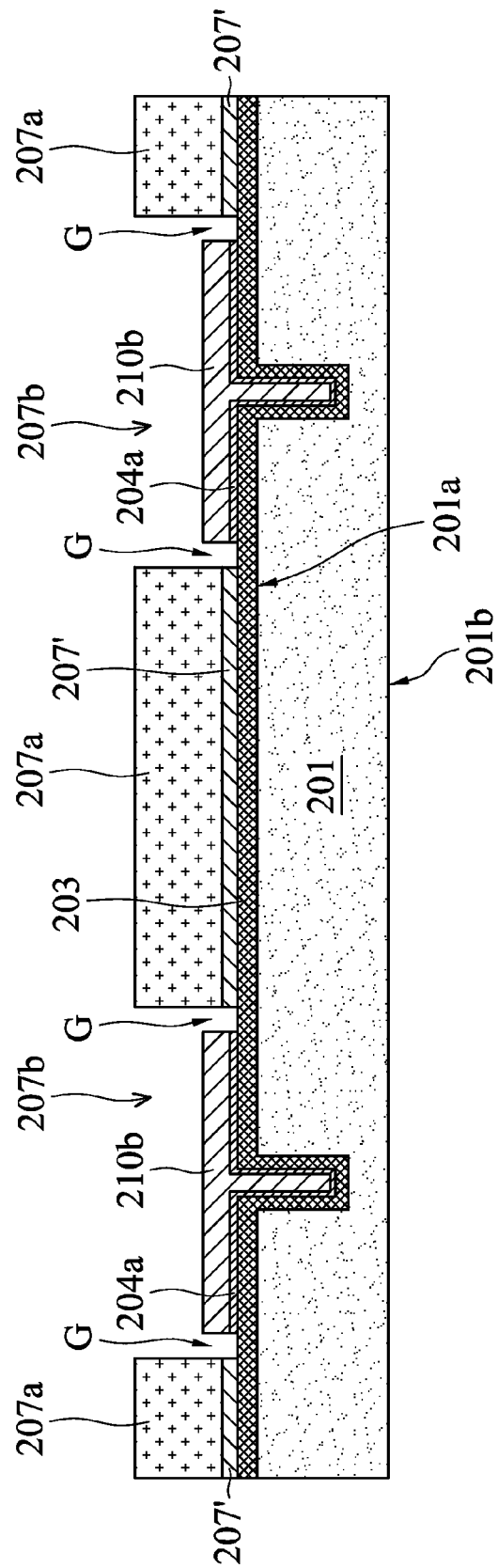

In FIG. 9C, the exposed CVD diamond film 207' in the openings 207b is removed by an etching process, such as RIE, using the masking layer 207a as an etch mask, such that the CVD diamond film 207' under the masking layer 207a is spaced apart from the first conductive pattern layer by gaps G.

Figure 9D:
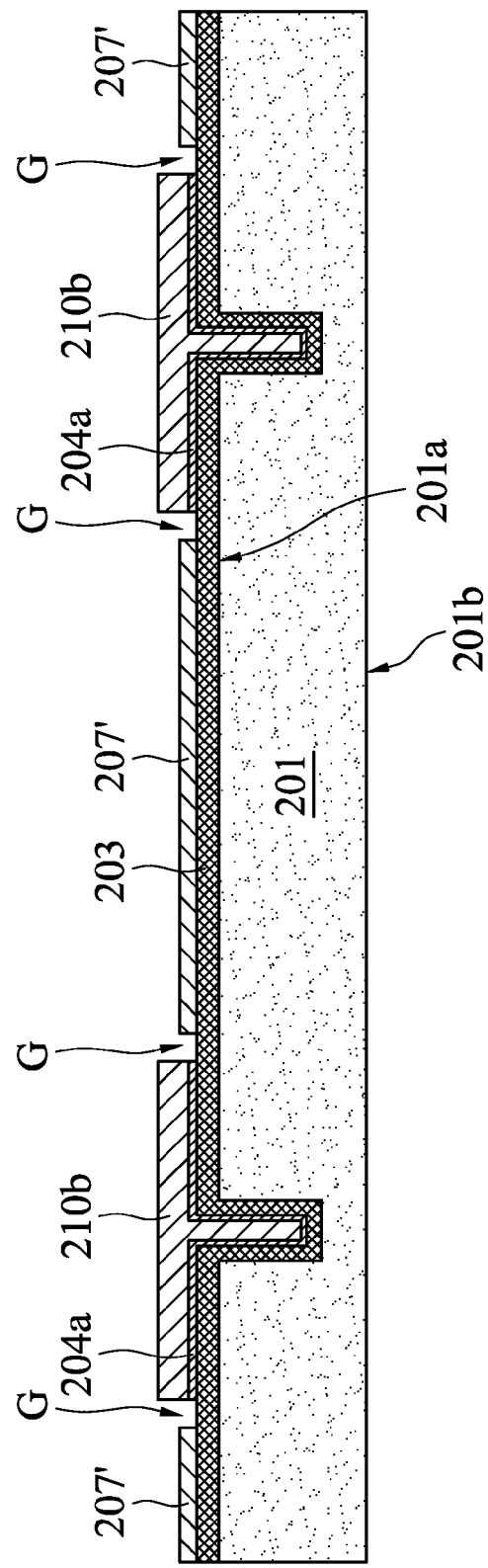

In FIG. 9D, the masking layer 207a is removed. Next, a thinning process may be performed to remove a portion of the body 201 from the second surface 201b of the body 201 until the barrier layer 204a and the conductive layer 210b in the body 201 is exposed, thereby forming a through via 210 (i.e., the barrier layer 204a and the conductive layer 210b in each opening 201c) in the body 201. The process steps shown in FIG. 5F may be performed on the structure shown in the FIG. 9D, to complete a heat dissipation structure. The heat dissipation structure may further be mounted under an electronic device 100 to form the electronic package 10' shown in FIG. 2-1.

Figure 6A:
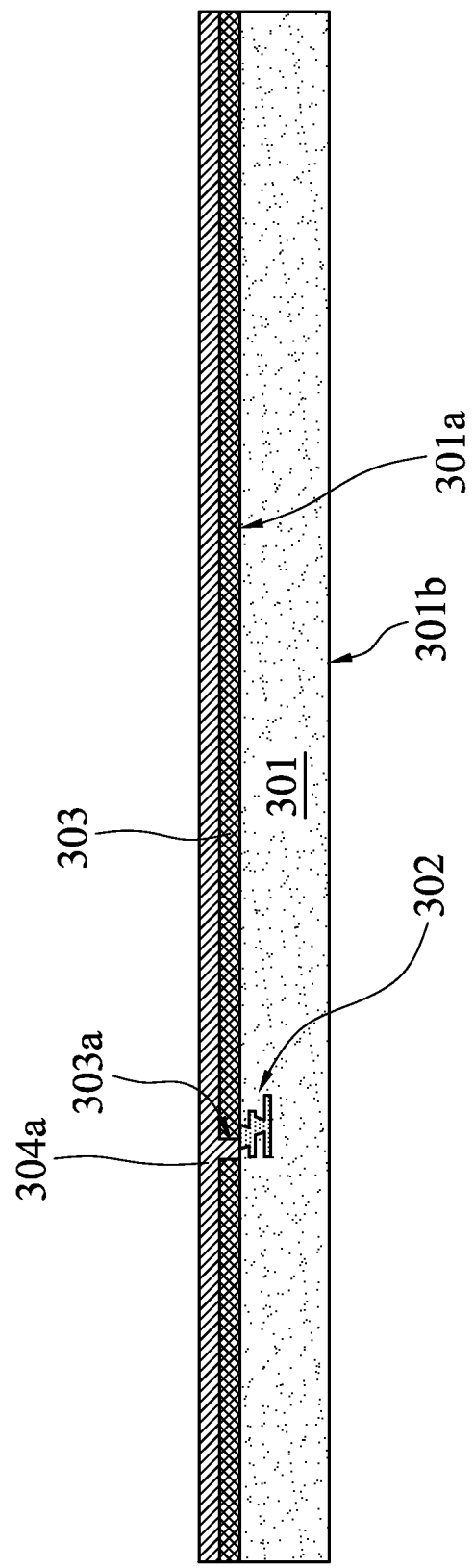
FIGS. 6A to 6J are cross sections of further another exemplary embodiment of a method for fabricating a heat dissipation structure for an electronic device according to the disclosure.

FIGS. 6A to 6J are cross sections of further another exemplary embodiment of a method for fabricating a heat dissipation structure for an electronic device according to the disclosure. Referring to FIG. 6A, a body 301 having a first surface 301a (e.g., an upper surface) and a second surface 301b (e.g., a bottom surface) opposite to the first surface 201a is provided. In the embodiment, the body 301 may be a semiconductor chip comprising at least one interconnect structure 302 (which comprises multiple metal layers and conductive plugs connected thereto) and at least one semiconductor device (not shown), such as transistor, resistor, capacitor or other semiconductor devices well known in the art, therein. The interconnect structure 302 is electrically connected to the semiconductor device.

Next, a silicon-containing insulating layer 303, made of material such as silicon nitride, TEOS oxide, or silicon dioxide, is formed on the first surface 301a of the body 301 by a thermal oxidation or deposition process. Thereafter, an opening is formed in the silicon-containing insulating layer 303 to expose the interconnect structure 302 in the body 301. A barrier layer 304a (e.g., made of TiW/Cu or other well known metal barrier materials) is blanket-like deposited on the silicon-containing insulating layer 303 by a sputtering process or other suitable deposition processes and fills the opening to form a conductive plug 303a therein. In the embodiment, the barrier layer 304a may serve as a seed layer for a subsequent metal plating process.

Figure 6B:
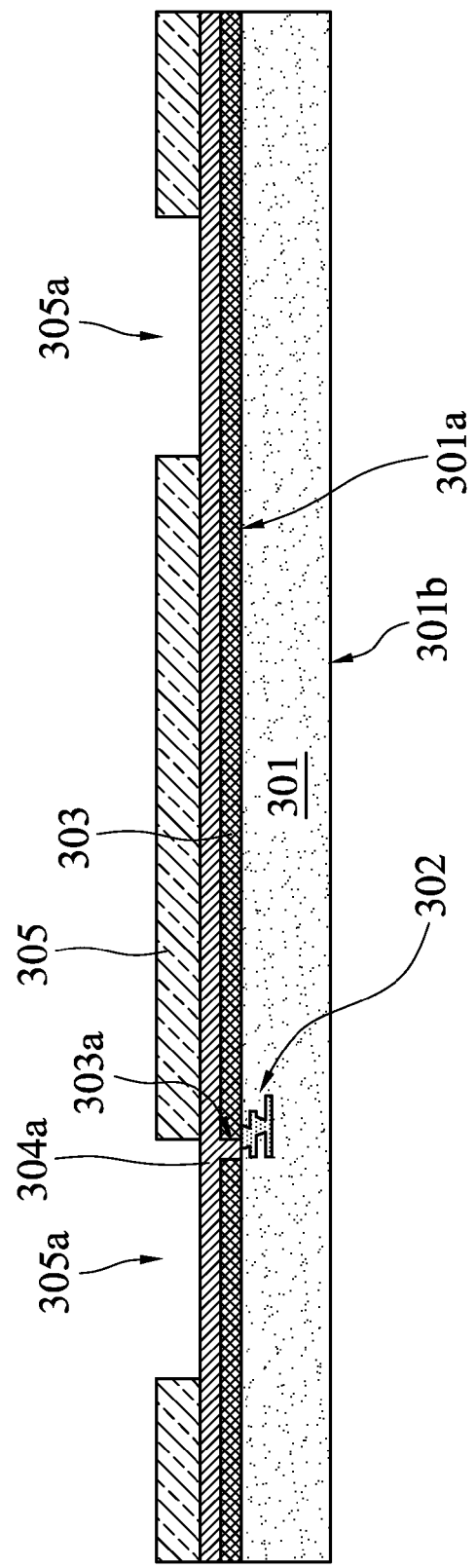
Figure 6C:
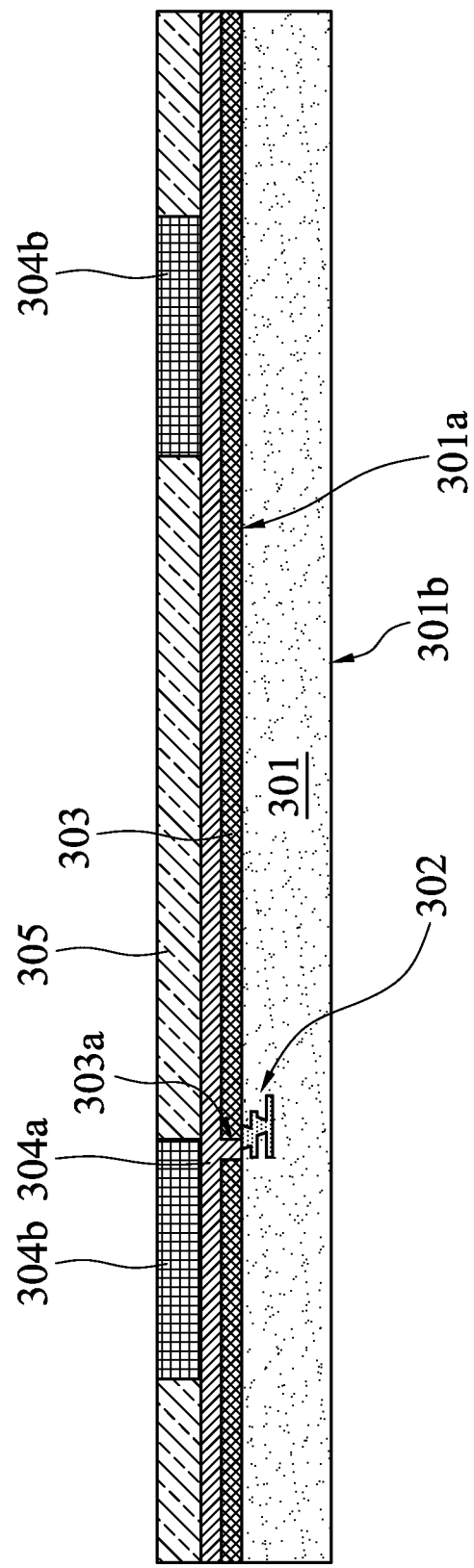

Referring to FIG. 6B, a photoresist layer 305 is formed on the barrier layer 304a. Thereafter, an opening pattern 305a is formed in the photoresist layer 305 by the conventional lithography process to partially expose the barrier layer 304a, to thereby fabricate a conductive pattern layer in subsequent processes. Referring to FIG. 6C, a conductive layer 304b is filled into the opening pattern 305a. For example, the conductive layer 304b is formed by a plating process using the exposed barrier layer 304a as a seed layer.

Figure 6D:
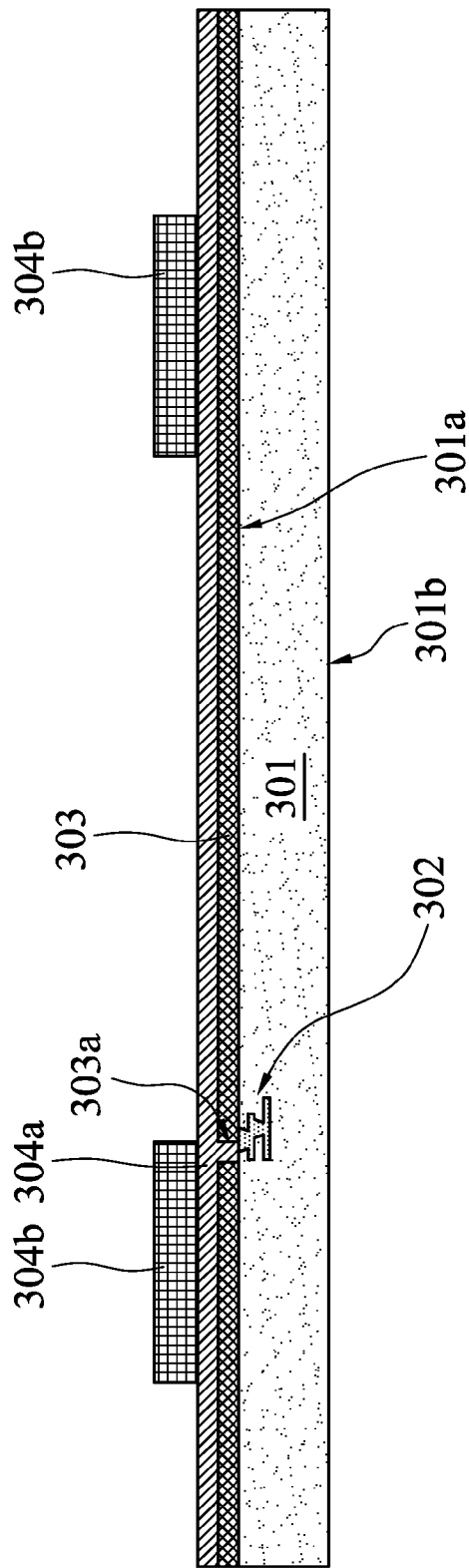
Figure 6E:
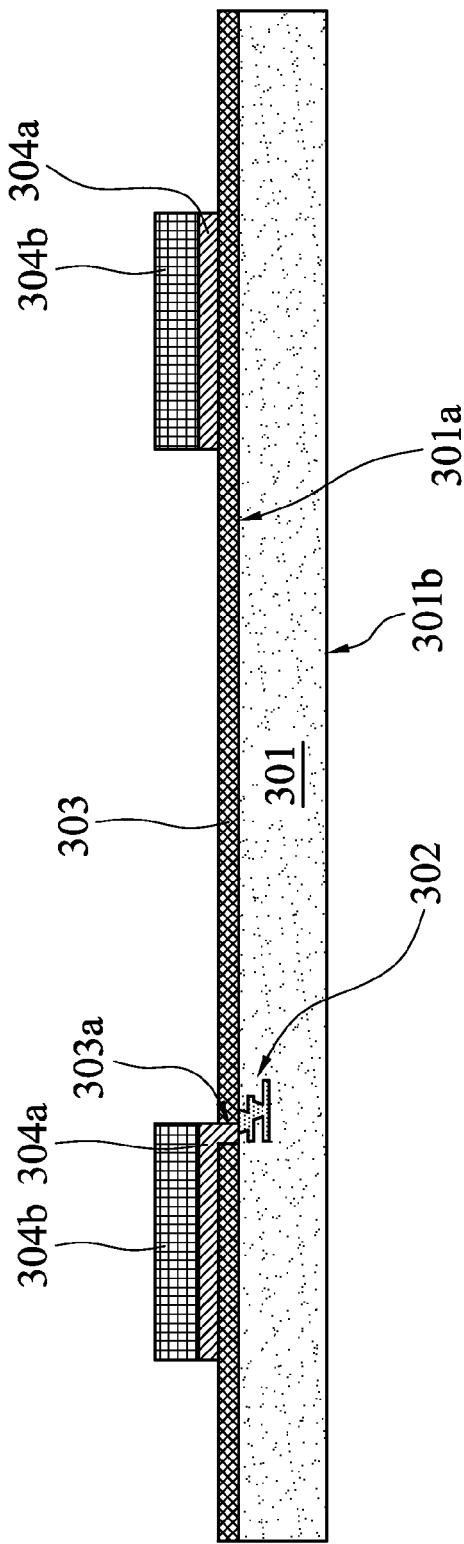

Thereafter, the photoresist layer 305 and the barrier layer 304a thereunder are removed successively to form a first conductive pattern layer (comprising the barrier layer 304a and the conducive layer 304b), while partially exposing the silicon-containing insulating layer 303, as shown in FIGS. 6D and 6E, respectively. The first conductive pattern layer is electrically connected to the interconnect structure 302 by the conductive plug 303a.

Figure 6F:
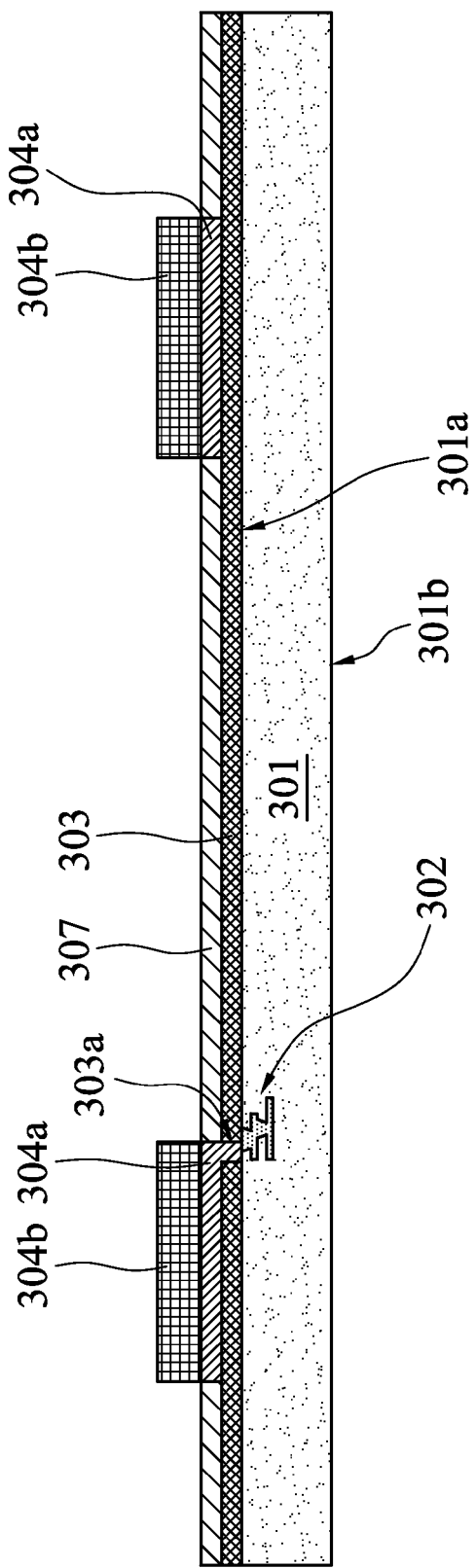

Referring to FIG. 6F, a UNCD film 307 is formed on the exposed silicon-containing insulating layer 303, such that the first conductive pattern layer is substantially enclosed by the UNCD film 307, and the UNCD film 307 and the first conductive pattern layer do not overlap with each other as viewed from a top-view perspective.

Figure 6G:
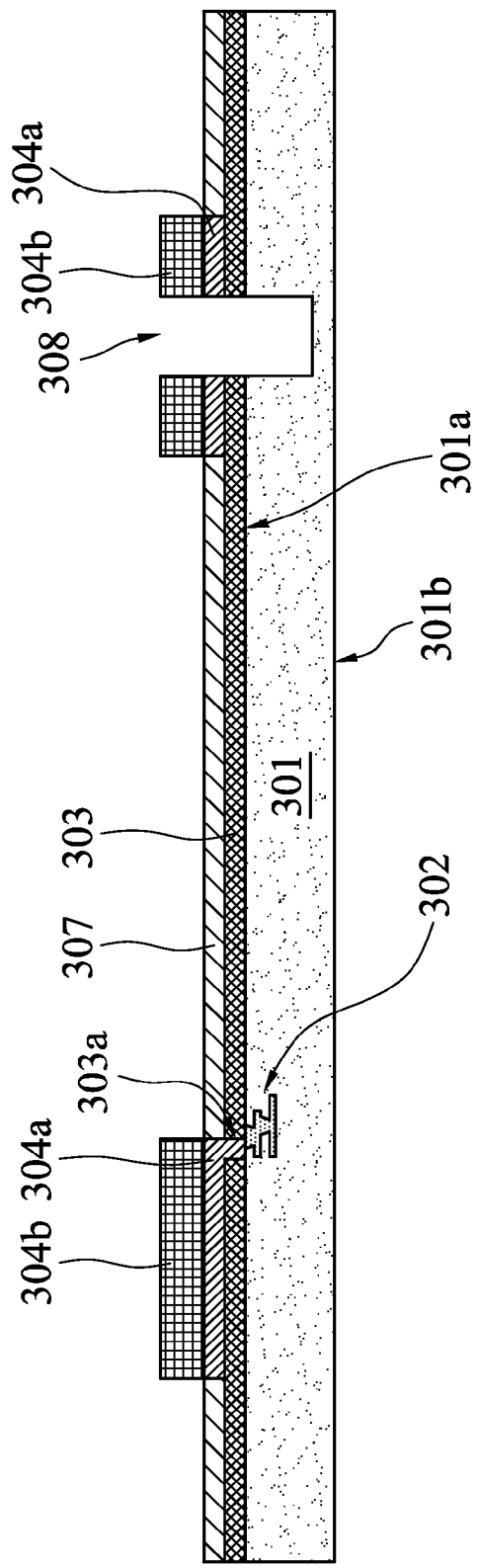

Referring to FIG. 6G, at least one opening 308 is formed in the first conductive pattern layer by a conventional etching process, such as dry etching process, and extends into a portion of the body 301 for fabricating a through via in the subsequent processes.

Figure 6H:
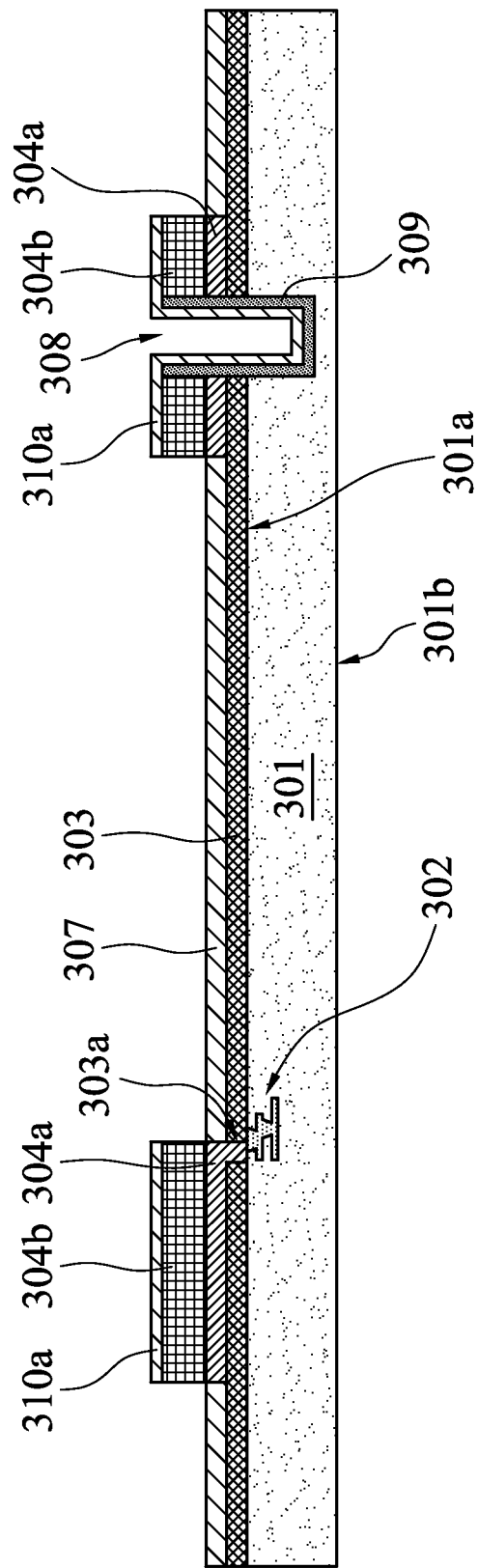

Referring to FIG. 6H, an insulating layer 309, such as silicon nitride, silicon dioxide, or UNDC, is formed on sidewalls and a bottom of the opening 308. Thereafter, a barrier layer 310a, serving as a seed layer, is formed on the first conductive pattern layer and covers the insulating layer 309 on the sidewalls and the bottom of the opening 308. The barrier layer 310a may comprise the same or similar materials as that of barrier layer 304a.

Figure 6I:
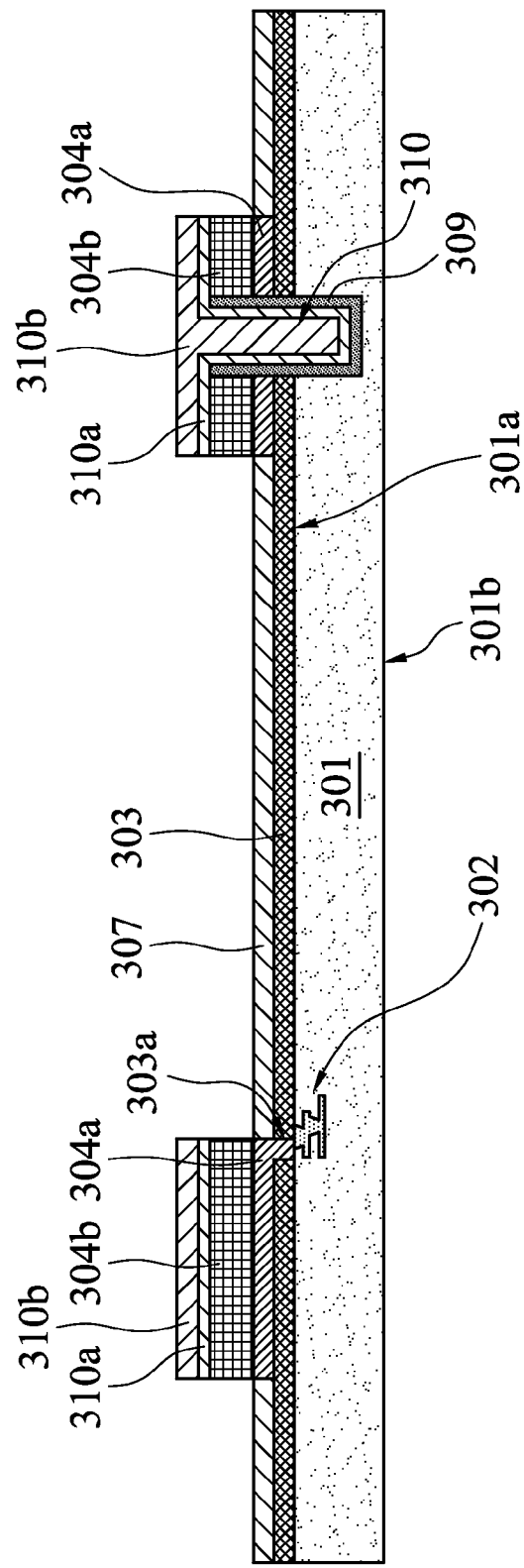

Referring to FIG. 6I, a conductive layer 310b is formed on the barrier layer 310a on the first conductive pattern layer and fills the opening 308 (shown in FIG. 6H) by a plating process or other suitable deposition processes.

Figure 6J:
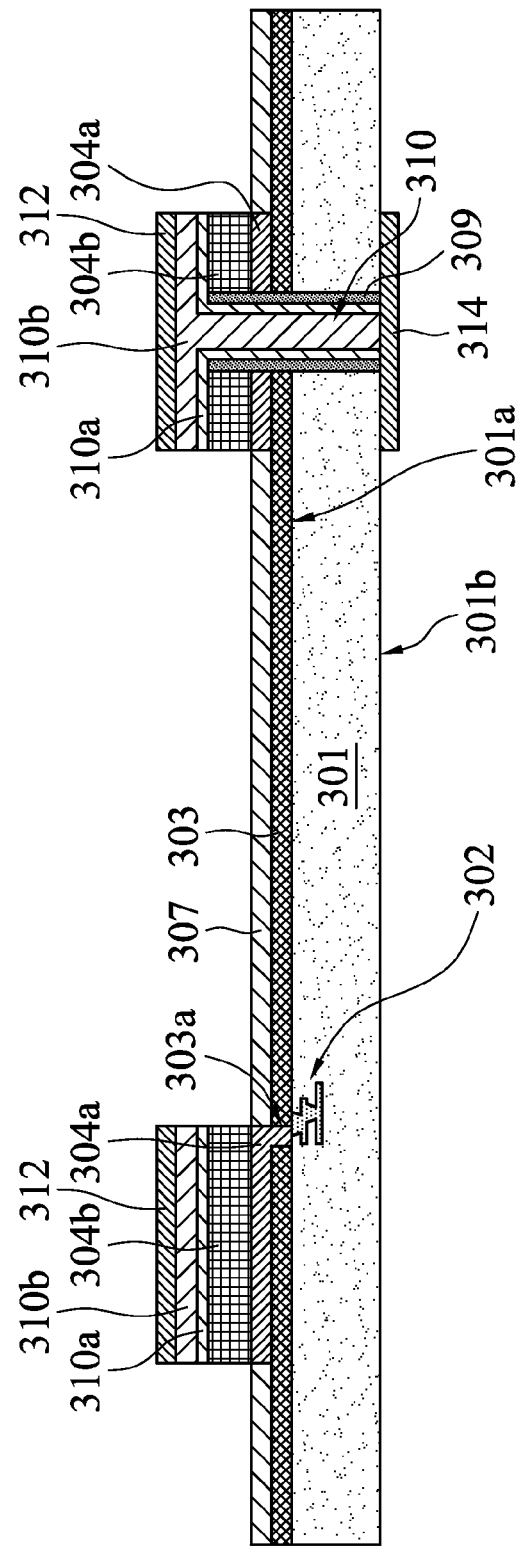
Figures 1, 6J:
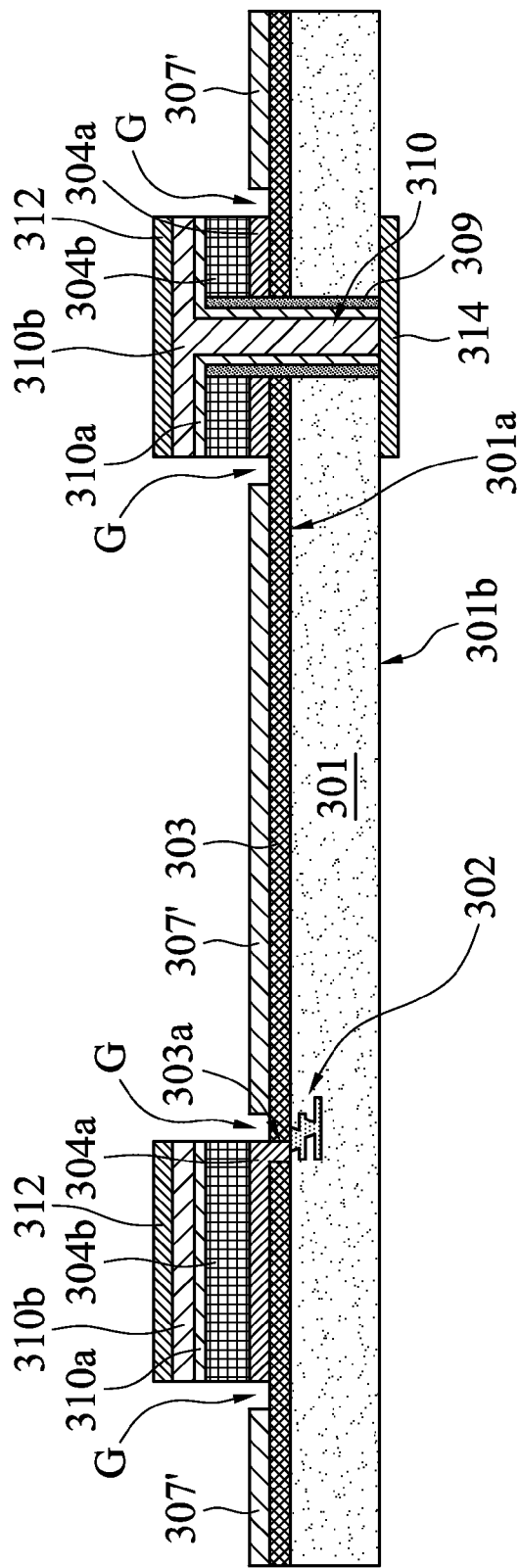

Referring to FIG. 6J, a thinning process may be performed to remove a portion of the body 301 from the second surface 301b of the body 301 until the conductive layer 310b in the opening 308 (shown in FIG. 6H) of the body 301 is exposed, thereby forming a through via 310 (i.e., the barrier layer 310a and the conductive layer 310b in the opening 308) in the body 301. In the embodiment, the through via 310 extends from the second surface 301b of the body 301 into the first conductive pattern layer. Finally, a conductive layer 312 is formed on the first conductive pattern layer by a plating process, while a second conductive pattern layer 314 is formed on the second surface 301b of the body 301, in which the second conductive pattern layer 314 is electrically connected to the first conductive pattern layer by the through via 310. As a result, description of the formation of the heat dissipation structure of the embodiment is completed. In one embodiment, the conductive layer 312 and the second conductive pattern layer 314 may comprise the same material (e.g., copper, tin or other well known solder materials) and be simultaneously formed of by a plating process. In another embodiment, the conductive layer 312 and the second conductive pattern layer 314 may comprise different conductive materials.

In some embodiments, a CVD diamond film 307' can be used instead of the UNCD film 307 in the heat dissipation structure, as shown in FIG. 6J-1. The CVD diamond film 307' can be formed by the process steps similar as the process steps shown in FIGS. 8A to 8D. Such a heat dissipation structure shown in FIG. 6J or 6J-1 may further be mounted under an electronic device (e.g., LED chip or other semiconductor chips) to form a three-dimensional integrated circuit (3DIC) with a heat dissipation structure.

Figure 7A:
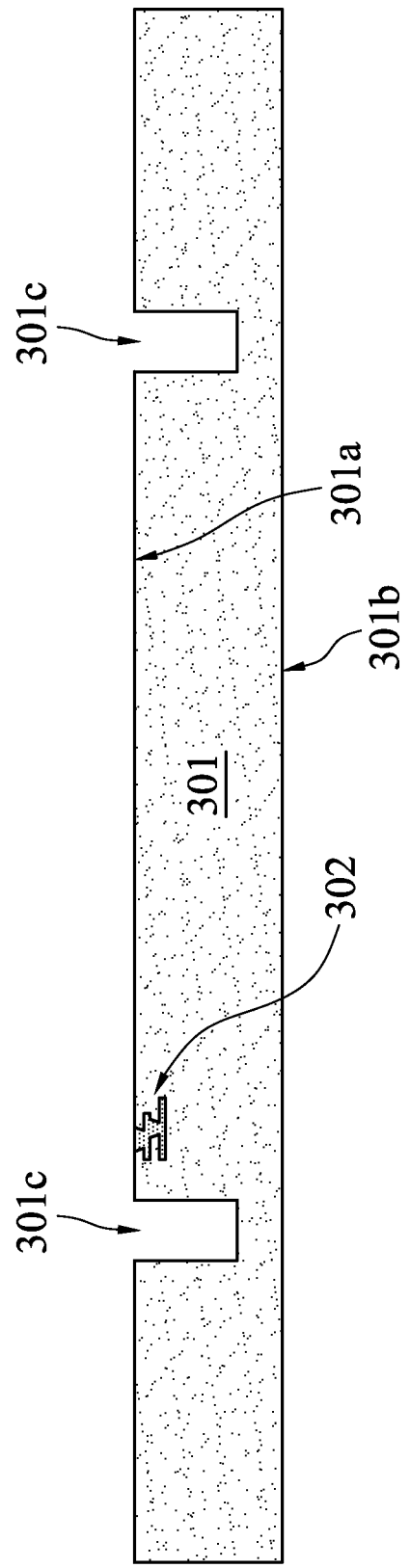
FIGS. 7A to 7F are cross sections of yet another exemplary embodiment of a method for fabricating a heat dissipation structure for an electronic device according to the disclosure.

FIGS. 7A to 7F are cross sections of yet another exemplary embodiment of a method for fabricating a heat dissipation structure for an electronic device according to the disclosure. Elements in FIGS. 7A to 7F that are the same as those in FIGS. 6A to 6J are labeled with the same reference numbers as in FIGS. 6A to 6J. Referring to FIG. 7A, a body 301 having a first surface 301a and a second surface 301b opposite to the first surface 301a is provided. In the embodiment, the body 301 may be a semiconductor chip comprising at least one interconnect structure 302 and at least one semiconductor device therein. The interconnect structure 302 is electrically connected to the semiconductor device. At least one opening 301c may be formed in the body 301 by an etching process for fabrication of through via(s) in the subsequent processes. Note that the number of openings 301c is dependant on design demands. In order to simplify the diagram, only two openings 301c are depicted.

Figure 7B:
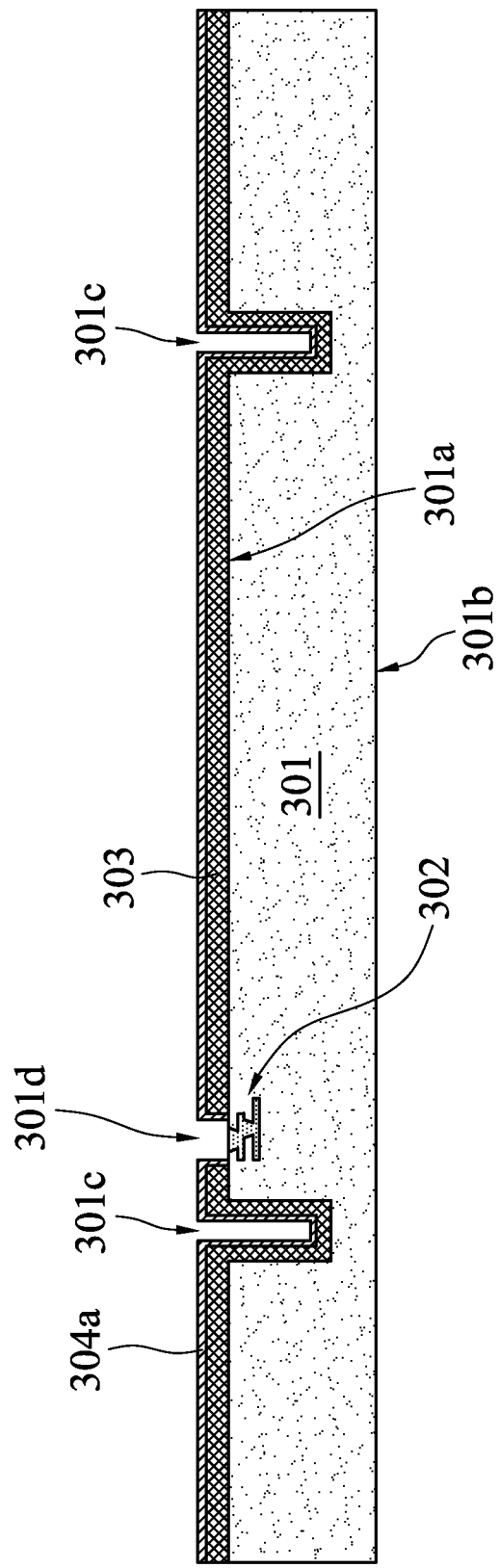

Referring to FIG. 7B, a silicon-containing insulating layer 303 is formed on the first surface 301a of the body 301 and extends on sidewalls and a bottom of each opening 301c. Thereafter, an opening 301d is formed in the silicon-containing insulating layer 303 to expose the interconnect structure 302 in the body 301. A barrier layer 304a is formed on the silicon-containing insulating layer 303 and fills the openings 301c and 301d.

Figure 7C:
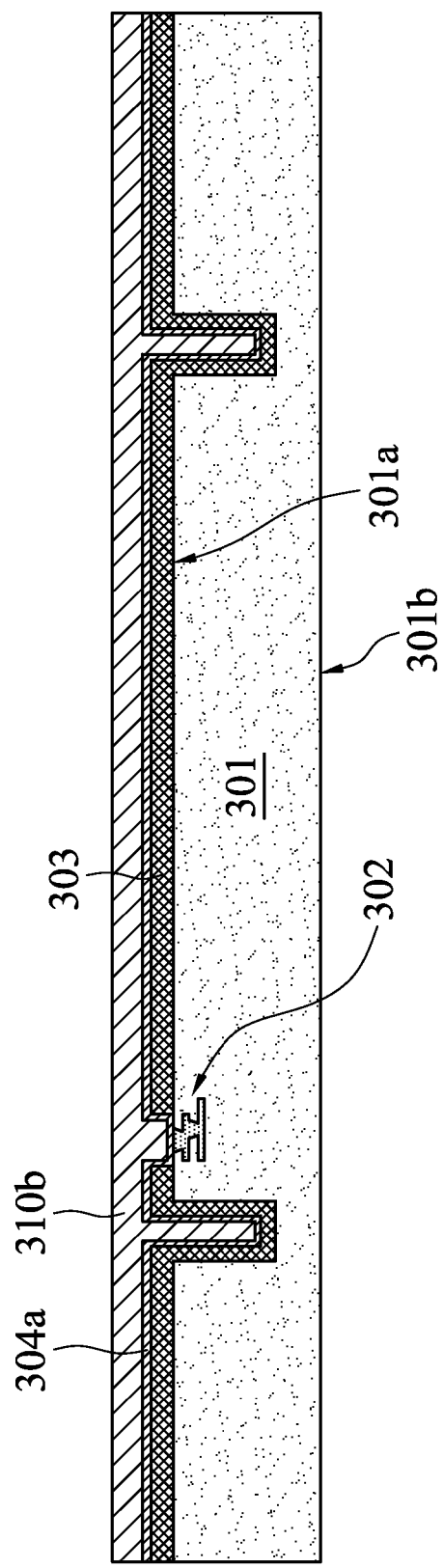
Figure 7D:
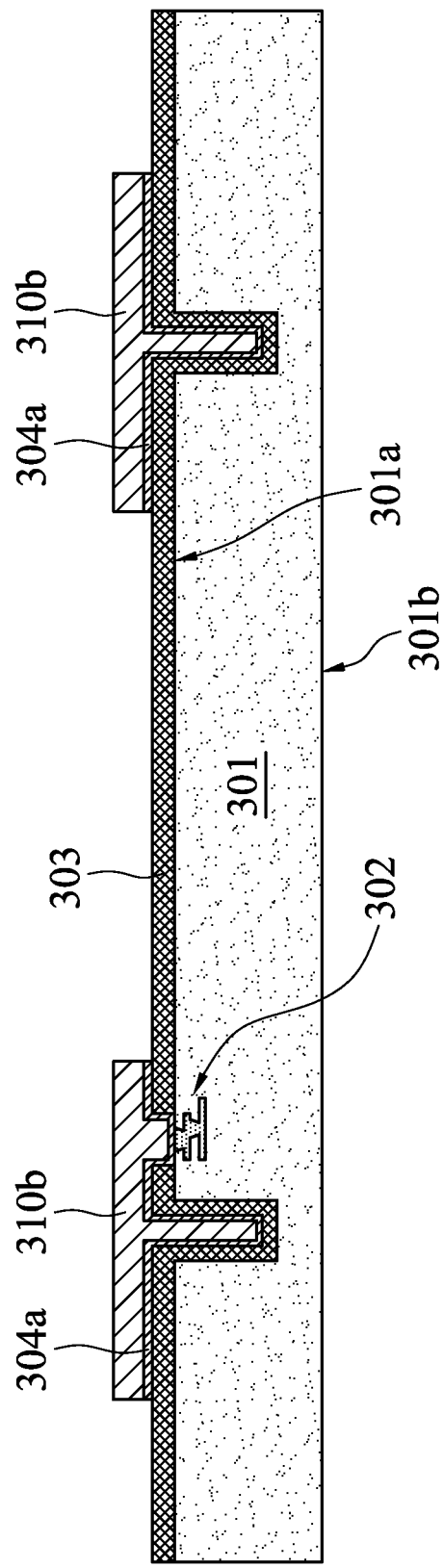

Referring to FIG. 7C, a conductive layer 310b is formed on the barrier layer 304a and fills the openings 301c and 301d of the body 301. Thereafter, the conductive layer 310b and the underlying barrier layer 304a are patterned by conventional lithography and etching processes, to form a first conductive pattern layer and partially expose the silicon-containing insulating layer 303, as shown in FIG. 7D.

Figure 7E:
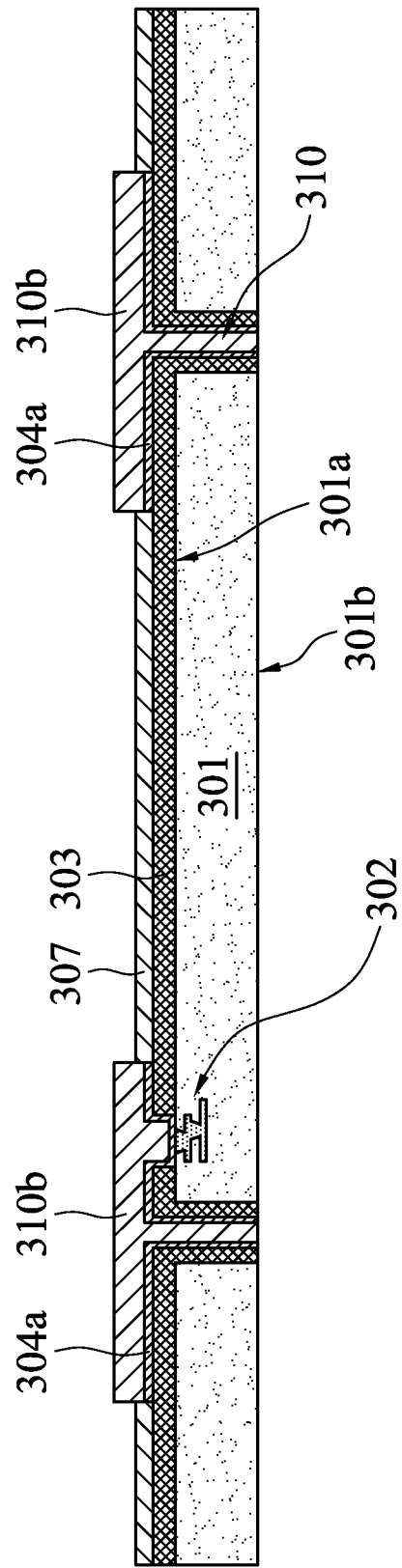

Referring to FIG. 7E, a UNCD film 307 is formed on the exposed silicon-containing insulating layer 303, such that the first conductive pattern layer is substantially enclosed by the UNCD film 307, and the UNCD film 307 and the first conductive pattern layer do not overlap with each other as viewed from a top-view perspective. Next, a thinning process may be performed to remove a portion of the body 301 from the second surface 301b of the body 301 until the barrier layer 304a and the conductive layer 310b in each opening 301c (shown in FIG. 7B) of the body 301 is exposed, thereby forming a through via 310 (i.e., the barrier layer 304a and the conductive layer 310b in each opening 301c) in the body 301.

Figure 7F:
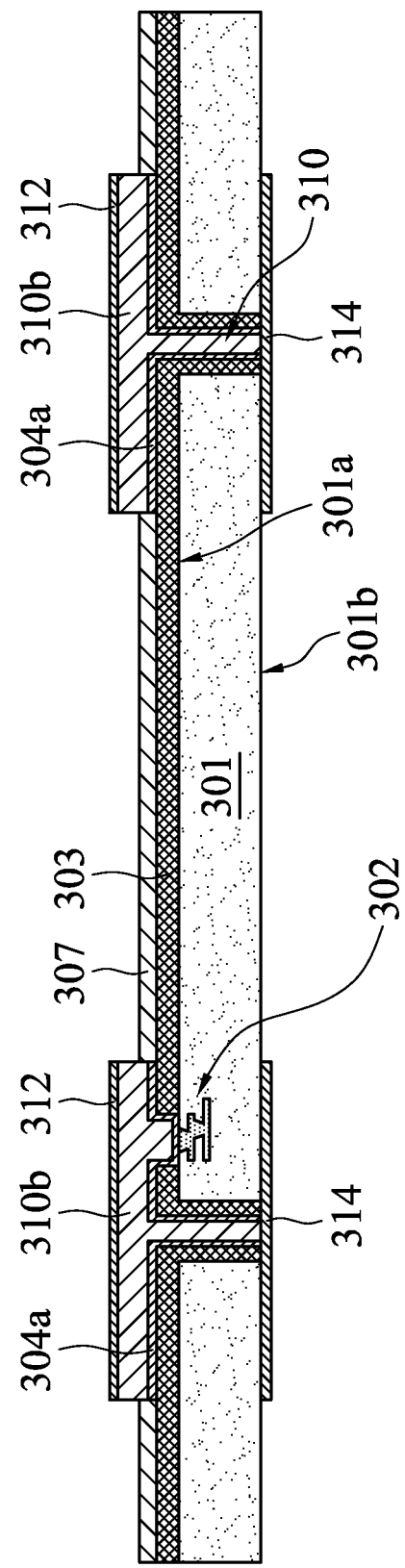
Figures 1, 7F:
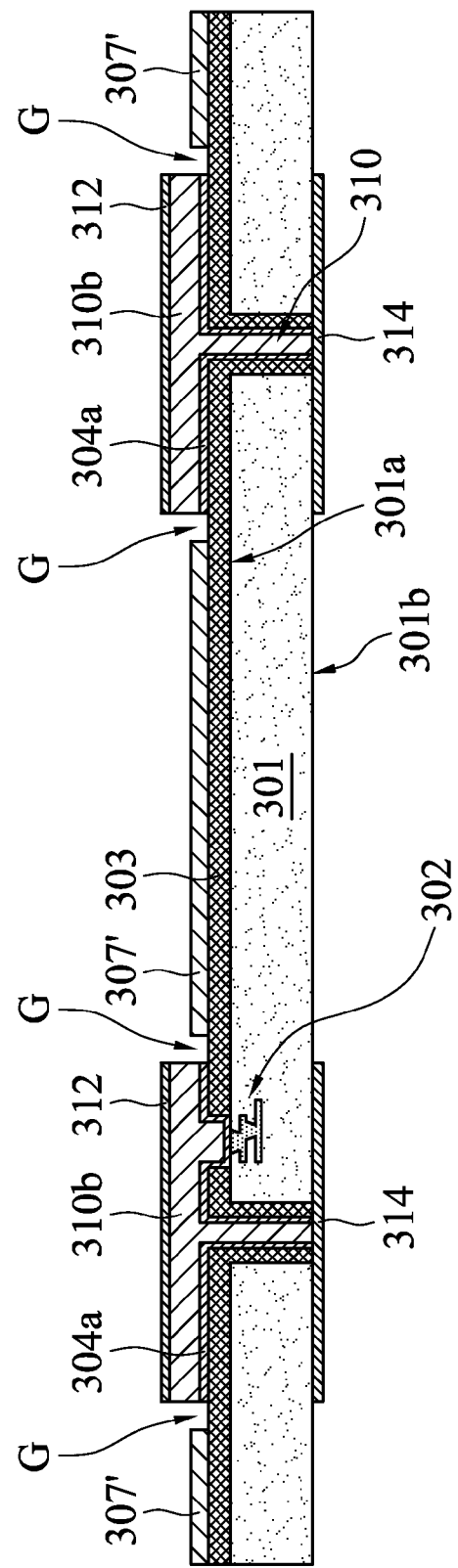

Referring to FIG. 7F, a conductive layer 312 is formed on the first conductive pattern layer by a plating process, while a second conductive pattern layer 314 is formed on the second surface 301b of the body 301, in which the second conductive pattern layer 314 is electrically connected to the first conductive pattern layer by the through via 310. As a result, description of the formation of the heat dissipation structure of the embodiment is completed.

Figure 7G:
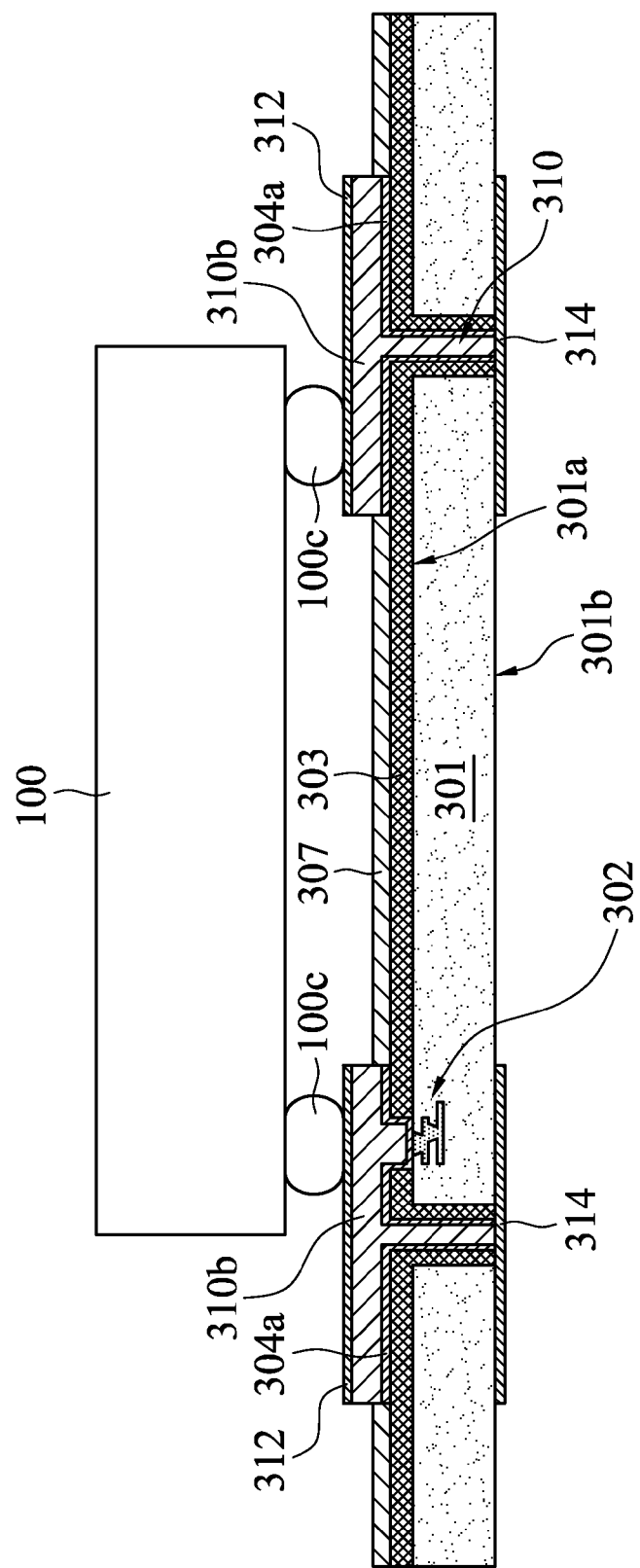
FIG. 7G is a cross section of an exemplary embodiment of a 3DIC with the heat dissipation structure shown in FIG. 7F.
Figures 1, 7G:
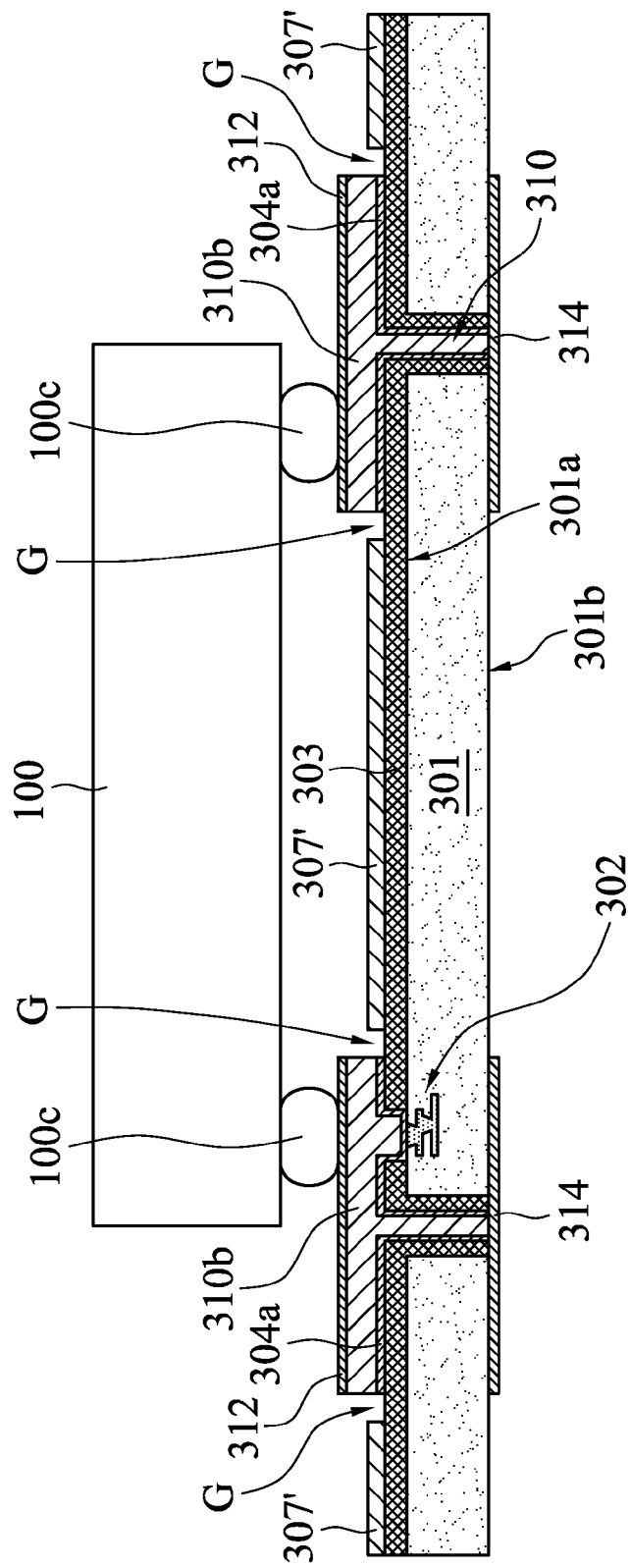

In some embodiments, a CVD diamond film 307' can be used instead of the UNCD film 307 in the heat dissipation structure, as shown in FIG. 7F-1. The CVD diamond film 307' can be formed by the process steps similar as the process steps shown in FIGS. 9A to 9D. Such a heat dissipation structure shown in FIG. 7F or 7F-1 may further be mounted under an electronic device 100 (e.g., LED chip or other semiconductor chips) by bumps 100c, to form a 3DIC with a heat dissipation structure, as shown in FIG. 7G or 7G-1.

According to the foregoing embodiments, since the UNCD film has a thermal conductive coefficient (i.e., about 1000 W/(m×K)) and the CVD diamond film has a thermal conductive coefficient (i.e., in a range of 1000 to 2000 W/(m×K)) which are better than that of the heat spreader, better heat dissipation can be provided on the package substrate or semiconductor chip. Moreover, compared to the conventional heat spreader, the UNCD film and the CVD diamond film can meet the continuous scaled-down trend of electronic devices. Additionally, since the UNCD film can entirely cover the silicon-containing insulating film and does not overlap with the conductive pattern layer as viewed from a top-view perspective, and since the CVD diamond film can also cover the silicon-containing insulating film and be spaced apart from the conductive pattern layer, the difficult processing problems and poor adhesion with metal occurring for DLC films can be eliminated, thereby increasing electronic device reliability and yield.

While the disclosure has been described by way of example and in terms of preferred embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat dissipation structure for an electronic device, comprising:
    a body having a first surface and a second surface opposite to the first surface;
    a silicon-containing insulating layer disposed on the first surface of the body;
    a chemical vapor deposition diamond film disposed on and only physically connected to the silicon-containing insulating layer; and
    a first conductive pattern layer disposed on the silicon-containing insulating layer, wherein the first conductive pattern layer is enclosed by and spaced apart from the chemical vapor deposition diamond film.

2. The structure of claim 1, wherein the body is a circuit board or package substrate.

3. The structure of claim 1, wherein the body is a semiconductor chip comprising at least one semiconductor device and at least one interconnect structure electrically connected to the semiconductor device therein.

4. The structure of claim 3, wherein the first conductive pattern layer is electrically connected to the interconnect structure.

5. The structure of claim 1, further comprising a second conductive pattern layer disposed on the second surface of the body.

6. The structure of claim 5, wherein the body comprises at least one through via therein, which is electrically connected between the first and second conductive pattern layers.

7. The structure of claim 6, wherein the through via is extended from the second surface of the body into the first conductive pattern layer.

8. The structure of claim 6, wherein an insulating layer is between the through via and the body, such that the through via is insulated from the body.

9. The structure of claim 8, wherein the insulating layer comprises silicon nitride or silicon dioxide.

10. The structure of claim 1, wherein the first conductive pattern layer comprises at least one barrier layer.

11. The structure of claim 1, wherein the silicon-containing insulating layer comprises silicon nitride, tetraethyl orthosilicate oxide or silicon dioxide.

12. An electronic package, comprising:
    a heat dissipation structure as claimed of claim 1; and
    an electronic device disposed on the chemical vapor deposition diamond film or the first conductive pattern layer and electrically connected to the first conductive pattern layer.

13. The package of claim 12, wherein the electronic device is electrically connected to the first conductive pattern layer by at least one wire or bump.

14. The package of claim 12, wherein the electronic device comprises a light-emitting diode chip or a semiconductor chip.

15. A method for fabricating a heat dissipation structure for an electronic device, comprising:
    providing a body having a first surface and a second surface opposite to the first surface;
    forming a silicon-containing insulating layer on the first surface of the body; and
    forming a first conductive pattern layer and a chemical vapor deposition diamond film on the silicon-containing insulating layer, wherein the first conductive pattern layer is enclosed by and spaced apart from the chemical vapor deposition diamond film, and the chemical vapor deposition diamond film is only physically connected to the silicon-containing insulating layer.

16. The method of claim 15, wherein the body is a circuit board or package substrate.

17. The method of claim 15, wherein the body is a semiconductor chip comprising at least one semiconductor device and at least one interconnect structure electrically connected to the semiconductor device therein.

18. The method of claim 17, wherein the first conductive pattern layer is electrically connected to the interconnect structure.

19. The method of claim 15, wherein the formation of the first conductive pattern layer comprises the steps of:
    forming a barrier layer on the silicon-containing layer;
    forming a photoresist layer on the barrier layer, wherein the photoresist layer has an opening therein;
    filling a conductive layer into the opening; and
    successively removing the photoresist layer and the barrier layer thereunder to form the first conductive pattern layer.

20. The method of claim 15, further comprising:
    forming at least one through via in the body, wherein the through via extends from the second surface of the body into the first conductive pattern layer; and
    forming a second conductive pattern layer on the second surface of the body, wherein the second conductive pattern layer is electrically connected to the first conductive pattern layer by the through via.

21. The method of claim 20, wherein the formation of the through via comprises the steps of:
    forming at least one opening in the first conductive pattern layer and extending into the body;
    forming an insulating layer on sidewalls and a bottom of the opening;
    filling a conductive layer into the opening; and
    removing a portion of the body from the second surface thereof until the conductive layer in the opening of the body is exposed to form the through via.

22. The method of claim 21, wherein the insulating layer comprises silicon nitride or silicon dioxide.

23. The method of claim 21, wherein the body comprises at least one opening, such that the silicon-containing insulating layer on the first surface of the body extends on sidewalls and a bottom of the opening.

24. The method of claim 23, wherein the formation of the first conductive pattern layer comprises the steps of:
    forming a barrier layer on the silicon-containing layer;
    forming a conductive layer on the barrier layer and filling the opening of the body; and
    patterning the conductive layer and the barrier layer thereunder to form the first conductive pattern layer.

25. The method of claim 24, further comprising:
    removing a portion of the body from the second surface thereof until the barrier layer or the conductive layer in the opening of the body is exposed to form a through via in the body; and
    forming a second conductive pattern layer on the second surface of the body, wherein the second conductive pattern layer is electrically connected to the first conductive pattern layer by the through via.

26. The method of claim 15, wherein the silicon-containing insulating layer comprises silicon nitride, tetraethyl orthosilicate oxide or silicon dioxide.

* * * * *